United States Patent
Imai et al.

(10) Patent No.: US 7,462,905 B2
(45) Date of Patent: Dec. 9, 2008

(54) NONVOLATILE SEMICONDUCTOR MEMORY DEVICE, SEMICONDUCTOR DEVICE AND METHOD OF MANUFACTURING NONVOLATILE SEMICONDUCTOR MEMORY DEVICE

(75) Inventors: Yutaka Imai, Tokyo (JP); Tatsuya Fukumura, Tokyo (JP); Toshiaki Omori, Tokyo (JP); Yutaka Takeshima, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 62 days.

(21) Appl. No.: 11/495,455

(22) Filed: Jul. 31, 2006

(65) Prior Publication Data

US 2007/0063256 A1 Mar. 22, 2007

(30) Foreign Application Priority Data

Sep. 22, 2005 (JP) ............................ 2005-276365

(51) Int. Cl.
*H01L 29/788* (2006.01)
*H01L 21/8239* (2006.01)
*H01L 23/528* (2006.01)

(52) U.S. Cl. .................. 257/316; 257/775; 257/E29.3; 438/266; 438/593; 438/619

(58) Field of Classification Search .......... 257/315; 438/201, 257, 619
See application file for complete search history.

(56) References Cited

U.S. PATENT DOCUMENTS

| | | | |
|---|---|---|---|
| 6,710,395 B2 * | 3/2004 | Kobayashi et al. | 257/315 |
| 7,015,090 B2 * | 3/2006 | Okazaki et al. | 438/243 |
| 7,064,380 B2 * | 6/2006 | Fukumura et al. | 257/315 |
| 7,312,123 B2 * | 12/2007 | Fukumura et al. | 438/257 |
| 2004/0038492 A1 * | 2/2004 | Okazaki et al. | 438/391 |
| 2005/0051832 A1 * | 3/2005 | Fukumura et al. | 257/314 |
| 2006/0022257 A1 * | 2/2006 | Fukumura et al. | 257/315 |
| 2006/0033141 A1 * | 2/2006 | Okazaki et al. | 257/301 |
| 2006/0194390 A1 * | 8/2006 | Imai et al. | 438/257 |
| 2006/0231884 A1 * | 10/2006 | Yonemochi et al. | 257/314 |

FOREIGN PATENT DOCUMENTS

| | | |
|---|---|---|
| JP | 2000-353740 | 12/2000 |
| JP | 2001-085519 | 3/2001 |
| JP | 2001-217310 | 8/2001 |
| JP | 2001-217310 | * 10/2001 |

* cited by examiner

*Primary Examiner*—Stephen W Smoot
(74) *Attorney, Agent, or Firm*—McDermott Will & Emery LLP

(57) ABSTRACT

A nonvolatile semiconductor memory device includes a semiconductor substrate, a first floating gate formed on a main surface of the semiconductor substrate, a second floating gate formed on the main surface of the semiconductor substrate, a first control gate formed on the first floating gate, a second control gate formed on the second floating gate, an interlayer insulating film, and a gap formed in the interlayer insulating film in at least a portion located between the first and second floating gates. Accordingly, a nonvolatile semiconductor memory device for which variations in threshold voltage of a memory cell can be suppressed and an appropriate read operation can be carried out, as well as a method of manufacturing the nonvolatile semiconductor memory device are provided. Further, a capacitance formed between interconnect lines can be reduced and the drive speed can be improved.

9 Claims, 23 Drawing Sheets

NONVOLATILE SEMICONDUCTOR MEMORY DEVICE, SEMICONDUCTOR DEVICE AND METHOD OF MANUFACTURING NONVOLATILE SEMICONDUCTOR MEMORY DEVICE

BACKGROUND OF THE INVENTION

1. Field of the Invention

The present invention relates to a nonvolatile semiconductor memory device and a semiconductor device as well as a method of manufacturing a nonvolatile semiconductor memory device.

2. Description of the Background Art

The nonvolatile semiconductor memory device and the semiconductor device have been miniaturized and downsized. As the nonvolatile semiconductor memory device is miniaturized, the spacing between floating gates is decreased and a capacitance formed between the floating gates adjacent to each other is increased. Therefore, in a read operation, a change in amount of electric charge accumulated in a floating gate adjacent to a floating gate of a selected memory cell causes a similar phenomenon to the phenomenon that occurs in the case where electric charge is injected into the floating gate of the selected memory cell. Accordingly, the threshold voltage of the selected memory cell varies, which results in a problem of difficulty in accurately reading electrical information of the selected memory cell. Further, as the semiconductor device is miniaturized, the spacing between interconnect lines provided in the semiconductor device is decreased and a capacitance between the interconnect lines is increased, which results in a problem that the processing speed of the semiconductor device decreases.

Under the circumstances, various semiconductor devices having a decreased capacitance between interconnect lines have recently been proposed. For example, Japanese Patent Laying-Open No. 2000-353740 discloses a semiconductor device having a semiconductor substrate, a plurality of interconnect lines formed on a main surface of the semiconductor substrate, an insulating film formed on the top surface of the interconnect line and having a larger width than the interconnect line, and an interlayer insulating film formed to cover the interconnect lines each.

In such a semiconductor device, the insulating film formed on the interconnect line forms an overhang, namely projecting edge, which facilitates formation of a gap in the interlayer insulating film in a region between interconnect lines, and accordingly the capacitance formed between the interconnect lines is decreased. Further, Japanese Patent Laying-Open No. 2001-217310 discloses a semiconductor device having a semiconductor substrate, a plurality of interconnect lines formed via a first electrically conductive film on a main surface of the semiconductor substrate, a second electrically conductive film formed on the top surface of the interconnect line and larger in width than the interconnect line, and an interlayer insulating film formed to cover the interconnect lines.

In such a semiconductor device, the second electrically conductive film forms an overhang, a gap is formed in the interlayer insulating film in a region between interconnect lines, and accordingly a capacitance between the interconnect lines is decreased. Furthermore, Japanese Patent Laying-Open No. 2001-085519 discloses a semiconductor device having an interconnect line formed with its width increasing as the upward distance from the top of a main surface of a semiconductor substrate increases and an interlayer insulating film formed to cover the interconnect line.

In this semiconductor device, the top surface of the interconnect line has an overhang as formed and a gap is formed between interconnect lines. The capacitance formed between the interconnect lines is thus decreased.

SUMMARY OF THE INVENTION

In the above-described conventional semiconductor devices, all interconnect lines have overhang portions formed to extend in the longitudinal direction of the interconnect lines. Therefore, an air gap is also formed in a region where the spacing between interconnect lines is large. In the case where the air gap is formed in the region where the spacing between interconnect lines is large, the interlayer insulating film could not completely close the top end portion of the air gap to accordingly form an opening. In such a case where the opening of the air gap is formed in the interlayer insulating film, a resultant problem is that, in a subsequent cleaning process, a cleaning fluid could enter the air gap. Moreover, the conventional nonvolatile semiconductor memory has the problem, as described above, that an amount of electric charge accumulated in the floating gate located around a selected memory cell could cause the threshold voltage of the selected memory cell to vary.

The present invention is made in consideration of the aforementioned problems. An object of the present invention is to provide a nonvolatile semiconductor memory device in which variations of the threshold voltage of a memory cell are suppressed as well as a method of manufacturing the nonvolatile semiconductor memory device, and to provide a semiconductor device decreased in capacitance between interconnect lines and increased in drive speed.

A nonvolatile semiconductor memory device according to the present invention includes: a semiconductor substrate; a first floating gate formed on a main surface of the semiconductor substrate with a first electrically insulating film therebetween; a second floating gate formed on the main surface of the semiconductor substrate with a second electrically insulating film therebetween; a first control gate formed on the first floating gate with a third electrically insulating film therebetween and having a first wider portion larger than the first floating gate in width in the direction parallel with the main surface of the semiconductor substrate; a second control gate formed on the second floating gate with a fourth electrically insulating film therebetween and having a second wider portion larger than the second floating gate in width in the direction parallel with the main surface of the semiconductor substrate; an interlayer insulating film formed to cover the first control gate and the second control gate; and a gap formed in the interlayer insulating film in at least a portion located between the first floating gate and the second floating gate.

A semiconductor device according to the present invention includes: a semiconductor substrate; a first interconnect line formed on a main surface of the semiconductor substrate with a first electrically insulating film therebetween; a second interconnect line formed on the main surface of the semiconductor substrate with a second electrically insulating film therebetween to extend along the first interconnect line; a first electrically conductive film formed on a top surface of the first interconnect line and formed to be larger than the first interconnect line in width in the direction parallel with the main surface of the semiconductor substrate; a second electrically conductive film formed on a top surface of the second interconnect line and formed to be larger than the second interconnect line in width in the direction parallel with the main surface of the semiconductor substrate; a third electrically insulating film formed to cover the first electrically conductive film and the second electrically conductive film; a gap formed in the third electrically insulating film in at least a portion located between the first interconnect line and the second interconnect line; a first region where the distance between the first interconnect line and the second interconnect line is at most a predetermined value; and a second region where the distance between the first interconnect line and the second interconnect line is larger than the predetermined value. The first electrically conductive film and the second electrically conductive film are formed in the first region.

A method of manufacturing a nonvolatile semiconductor memory device according to the present invention includes the steps of: forming a first floating gate on a main surface of a semiconductor substrate with a first electrically insulating film therebetween and forming a second floating gate on the main surface of the semiconductor substrate with a second electrically insulating film therebetween; forming a first control gate on a top surface of the first floating gate with a third electrically insulating film therebetween and forming a second control gate on a top surface of the second floating gate with a fourth electrically insulating film therebetween; forming a first wider portion of the first control gate by reducing, in film size in the direction parallel with the main surface of the semiconductor substrate, the first floating gate and a part of the first control gate, the first wider portion being larger, in width in the direction parallel with the main surface of the semiconductor substrate, than the first floating gate reduced in film size; forming a second wider portion of the second control gate by reducing, in film size in the direction parallel with the main surface of the semiconductor substrate, the second floating gate and a part of the second control gate, the second wider portion being larger, in width in the direction parallel with the main surface of the semiconductor substrate, than the second floating gate reduced in film size; and forming an interlayer insulating film covering the first control gate and the second control gate, allowing a portion of the interlayer insulating film that covers the first wider portion to contact a portion of the interlayer insulating film that covers the second wider portion, and forming a gap between the floating gates.

With the nonvolatile semiconductor memory device and the method of manufacturing the nonvolatile semiconductor memory device according to the present invention, variations in threshold voltage of a memory cell can be suppressed, an appropriate read operation is carried out. Further, with the semiconductor device according to the present invention, a capacitance formed between interconnect lines can be reduced and the drive speed can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
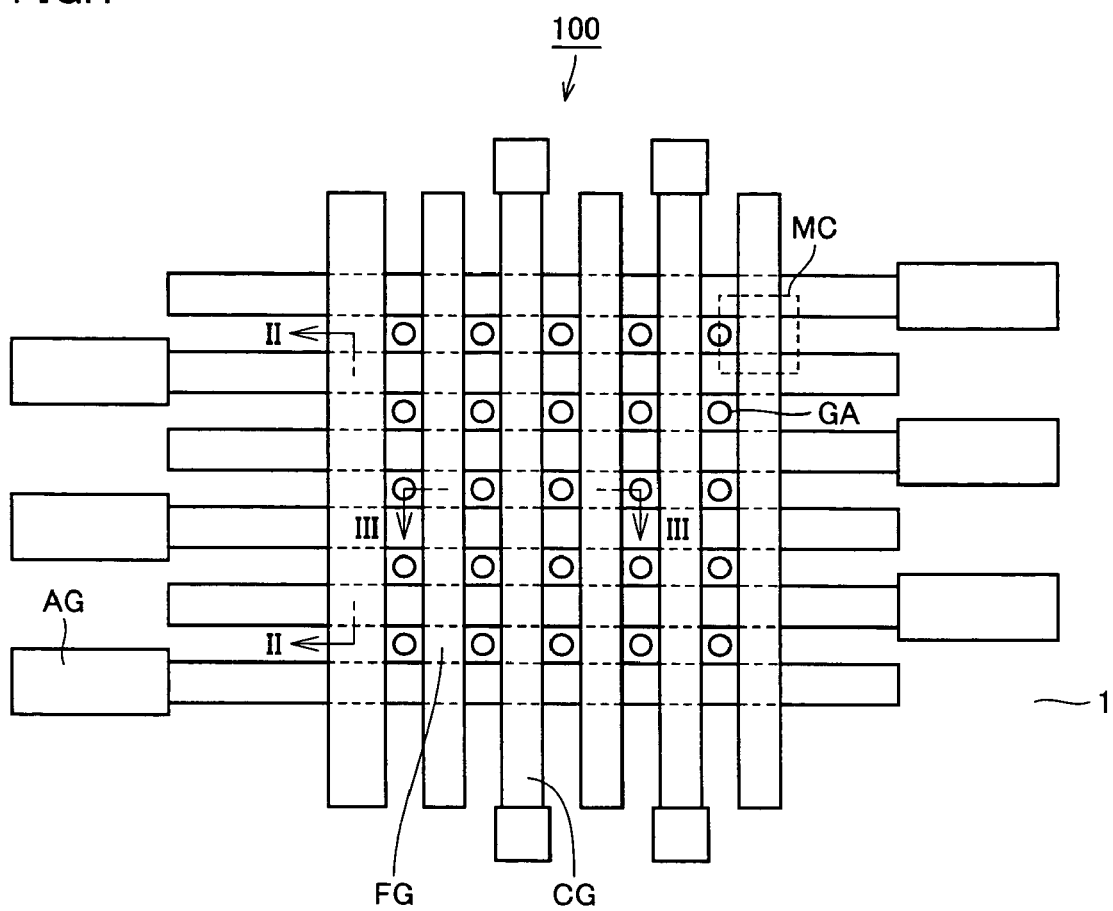
FIG. 1 is a plan view of a nonvolatile semiconductor memory device according to a first embodiment.

With reference to FIGS. 1 to 15, a nonvolatile semiconductor memory device 100 according to a first embodiment is described. FIG. 1 is a plan view of nonvolatile semiconductor memory device 100 according to the first embodiment. As shown in FIG. 1, on a main surface of a semiconductor substrate 1, a plurality of assist gates AG spaced from each other extend in the same direction, and a plurality of control gates CG spaced from each other extend in a direction crossing assist gates AG. Further, in a region that is located between assist gates AG and located on the main surface of semiconductor substrate 1 and under control gates CG, floating gates FG are formed. Thus, on the main surface of semiconductor substrate 1, a plurality of memory cells MC are formed. Further, on the main surface of semiconductor substrate 1, air gaps GA are formed between floating gates FG that are adjacent to each other in the direction in which assist gates AG extend.

Figure 2:
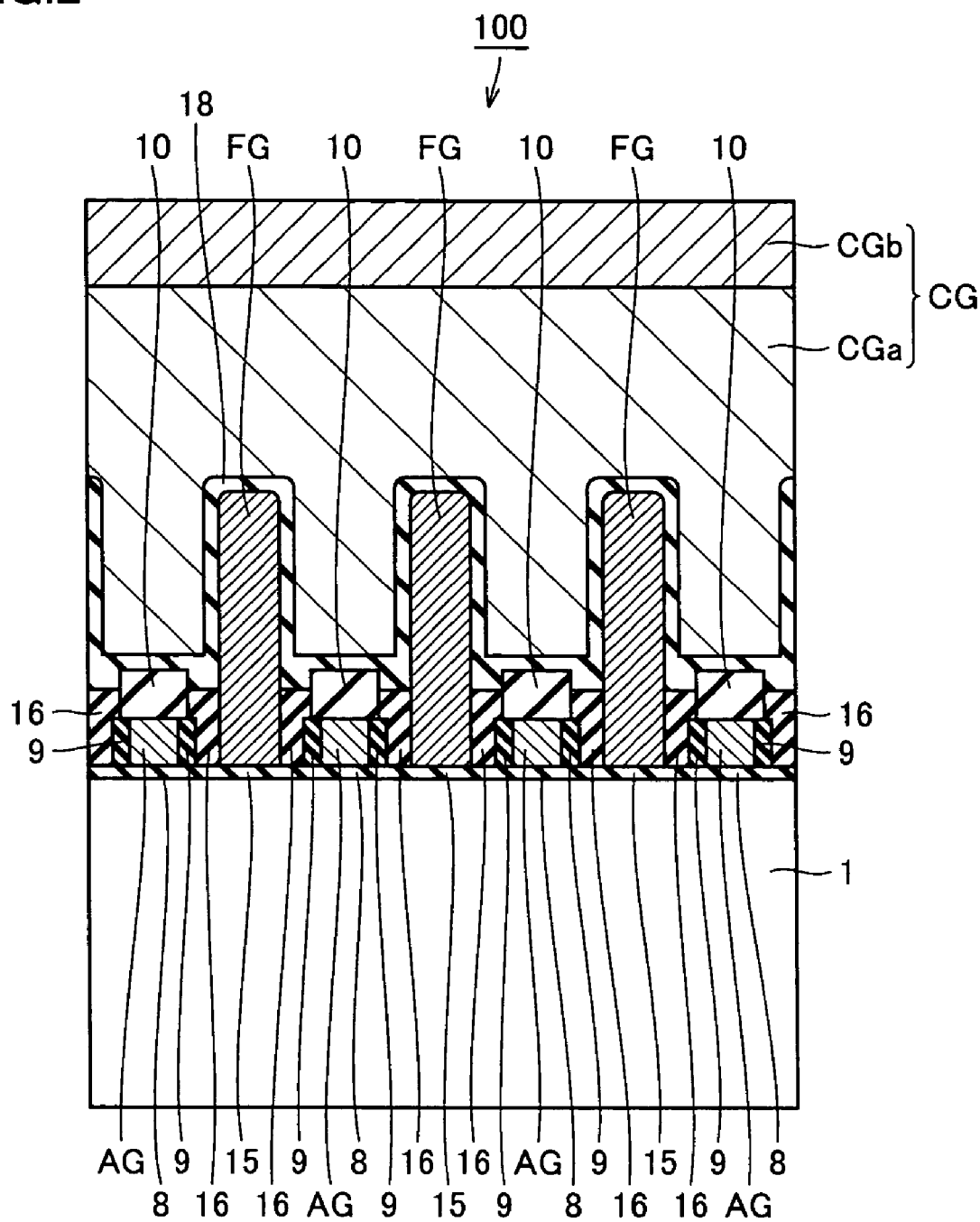
FIG. 2 a cross-sectional view along line II-II in FIG. 1.

FIG. 2 is a cross-sectional view along line II-II in FIG. 1. As shown in FIG. 2, nonvolatile semiconductor memory device 100 includes semiconductor substrate 1, assist gates AG formed on the main surface of semiconductor substrate 1 with an electrically insulating film 8 therebetween, floating gates FG formed on the main surface of semiconductor substrate 1 with an electrically insulating film 15 therebetween, and control gates CG formed on the top surface of floating gates FG with an electrically insulating film 18 therebetween. Assist gates AG are formed for example of a low-resistance polycrystalline silicon film. Insulating film 8 formed under assist gates AG is made for example of silicon oxide and has a thickness of approximately 8.5 nm in terms of the thickness of silicon dioxide.

On the side surface of assist gates AG, an electrically insulating film 9 made for example of silicon oxide is formed. Further, on the top surface of assist gates AG, an electrically insulating film 10 made for example of silicon nitride (such as $Si_3N_4$) is formed.

Control gate CG is formed of a multilayered film comprised of an electrically conductive film CGa made for example of low-resistance polycrystalline silicon and an electrically conductive film CGb formed on the top surface of conductive film CGa and formed for example of such a refractory-metal silicide film as tungsten silicide ($WSi_x$).

Floating gate FG is a charge storage layer for data of memory cell MC as described above and made for example of low-resistance polycrystalline silicon.

On the main surface of semiconductor substrate 1 and under floating gate FG, insulating film 15 serving as a tunnel insulating film of memory cell MC is formed. Insulating film 15 is made for example of silicon oxide-nitride (SiON).

Between assist gate AG and floating gate FG, insulating film 9 and an insulating film 16 are formed to electrically insulate assist gate AG and floating gate FG from each other. Insulating film 16 is made for example of silicon oxide. Insulating film 18 is formed for example of a so-called ONO film comprised for example of silicone oxide, silicon nitride and silicon oxide deposited in this order from the lowest layer. Insulating film 18 has a thickness of approximately 16 nm for example in terms of the thickness of silicon dioxide.

Figure 3:
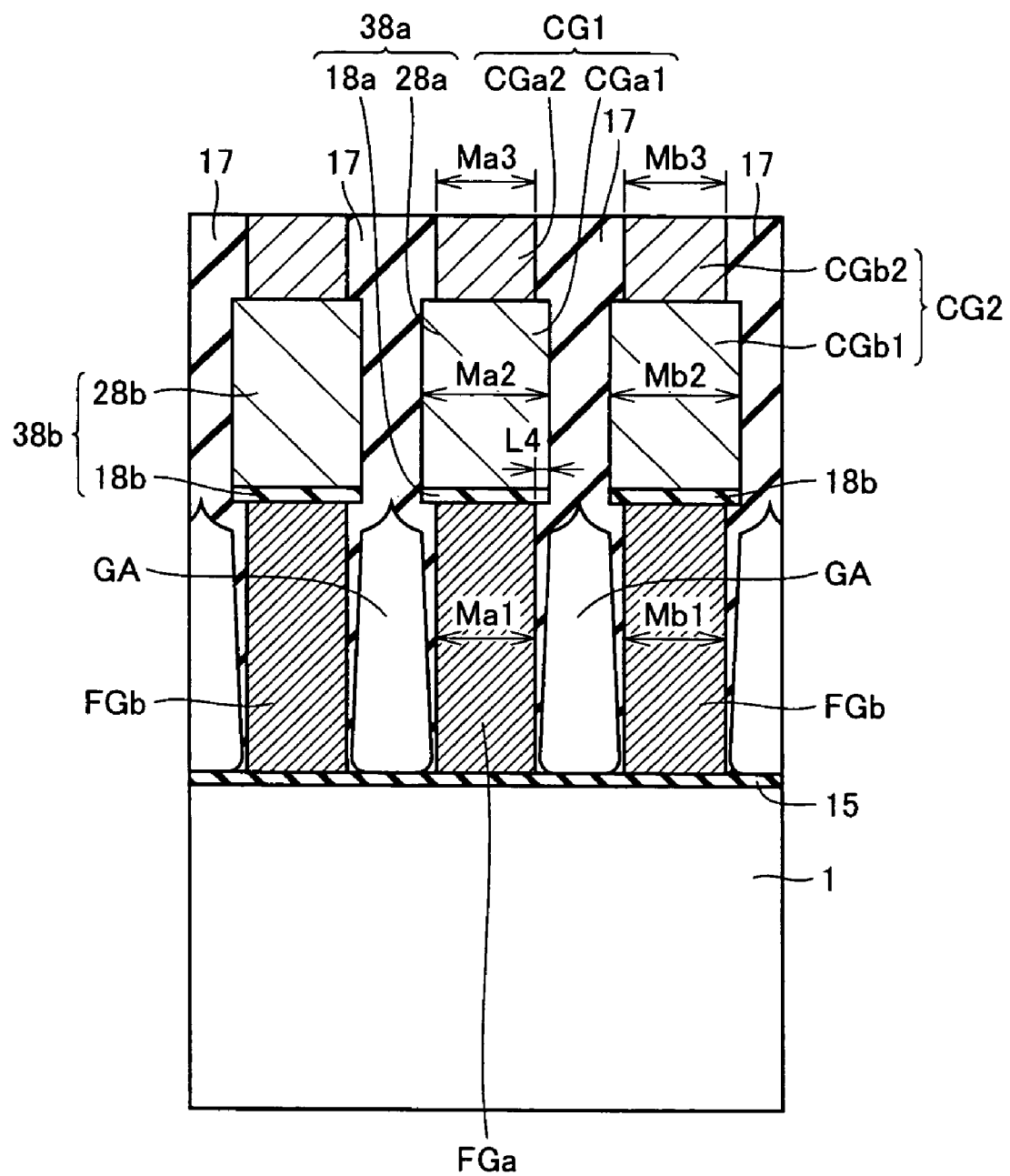
FIG. 3 is a cross-sectional view along line III-III in FIG. 1.

FIG. 3 is a cross-sectional view along line III-III in FIG. 1, which is a cross section in the direction orthogonal to the direction of control gate CG. As shown in FIG. 3, on the main surface of semiconductor substrate 1, a floating gate (first floating gate) FGa formed with insulating film (first insulating film) 15 therebetween, and a floating gate (second floating gate) FGb formed with insulating film 15 therebetween and located adjacent to floating gate FGa are provided, and an interlayer insulating film 17 is formed to cover control gates CG1, CG2. In interlayer insulating film 17, in a region located between floating gates FGa and FGb, air gap GA is formed.

Further, on the top surface of floating gate FGa, control gate CG1 is formed with an electrically insulating film 18a therebetween. On the top surface of floating gate FGb, control gate CG2 is formed with an electrically insulating film 18b therebetween.

Control gate CG1 includes an electrically conductive film CGa1 formed on the top surface of floating gate FGa with insulating film 18a therebetween, and an electrically conductive film CGa2 formed on the top surface of conductive film CGa1. Control gate CG2 includes an electrically conductive film CGb1 formed on the top surface of floating gate FGb with insulating film 18b therebetween, and an electrically conductive film CGb2 formed on the top surface of conductive film CGb2.

Conductive film CGa1 has width Ma2 that is in the direction parallel with the main surface of semiconductor substrate 1 and that is larger than width Ma1 of floating gate FGa that is in the direction parallel with the main surface of semiconductor substrate 1. Conductive film CGa2 has width Ma3 in the direction parallel with the main surface of semiconductor substrate 1 that is smaller than the width of conductive film CGa1. Further, conductive film CGb1 has width Mb2 in the direction parallel with the main surface of semiconductor substrate 1 that is larger than width Mb1 of floating gate FGb that is in the direction parallel with the main surface of semiconductor substrate 1. Conductive film CGb2 has width Mb3 in the direction parallel with the main surface of semiconductor substrate 1 that is smaller than width Mb2 of conductive film CGb1 that is in the direction parallel with the main surface of semiconductor substrate 1.

Thus, control gate CG1 has a wider portion 28a having its width larger than width Ma1 of floating gate FGa that is in the direction parallel with the main surface of semiconductor substrate 1. Further, control gate CG2 has a wider portion 28b having its width larger than width Mb1 of floating gate FGb that is in the direction parallel with the main surface of semiconductor substrate 1. Here, insulating films 18a, 18b are formed to have respective widths larger than widths Ma1, Mb1 of floating gates FGa, FGb that are in parallel with the main surface of semiconductor substrate 1.

Accordingly, on the top surface of floating gate FGa, an overhang portion 38a is formed that is comprised of conductive film CGa1 and insulating film 18a and has its width larger than width Ma1 of floating gate FGa that is in the direction parallel with semiconductor substrate 1. Further, on the top surface of floating gate FGb, an overhang portion 38b is formed that is comprised of conductive film CGb1 and insulating film 18b and has its width larger than width Mb1 of floating gate FGb that is in the direction parallel with semiconductor substrate 1. In the first embodiment, the width of overhang portions 38a, 38b and the width of wider portions 28a, 28b are identical to each other, and the width of overhang portions 38a, 38b in the direction parallel with the main surface of semiconductor substrate 1 is larger by approximately 15 nm than the width of floating gates FGa, FGb. Thus, the distance between overhang portions 38a and 38b in the direction parallel with the main surface of semiconductor substrate 1 is smaller than the distance between floating gates FGa and FGb.

Interlayer insulating film 17 is formed slightly on the main surface of semiconductor substrate 1 and also formed on the side surfaces of floating gates FGa, FGb. Interlayer insulating film 17 formed on the side surfaces of floating gates FGa, FGb has its width in the direction parallel with the main surface of semiconductor substrate 1 and the width increases as the upward distance from the substrate increases. In interlayer insulating film 17, those portions respectively covering overhang portions 38a, 38b contact each other, and the space between overhang portions 38a and 38b and the space between control gates CG1 and CG2 are filled with interlayer insulating film 17. Interlayer insulating film 17 is formed for example of a silicon oxide film.

Air gap GA is formed in interlayer insulating film 17 in a portion located under the region of contact between the portion of interlayer insulating film 17 covering overhang portion 38a and the one covering overhang portion 38b. Air gap GA is formed to extend from a portion on the main surface of semiconductor substrate 1 over the region between floating gates FGa and FGb. The top end of air gap GA is located near the bottom end of overhang portions 38a, 38b. Air gap GA has its width in the direction parallel with the main surface of semiconductor substrate 1 that is made smaller as the distance from the top of the main surface of semiconductor substrate 1 increases, and is closed on the bottom surface of overhang portions 38a, 38b.

Thus, between floating gates FGa and FGb adjacent to each other in the direction orthogonal to the direction in which control gates CG1, CG2 extend, air gap GA is formed and accordingly, the capacitance formed between floating gates FGa and FGb is reduced.

Figure 4:
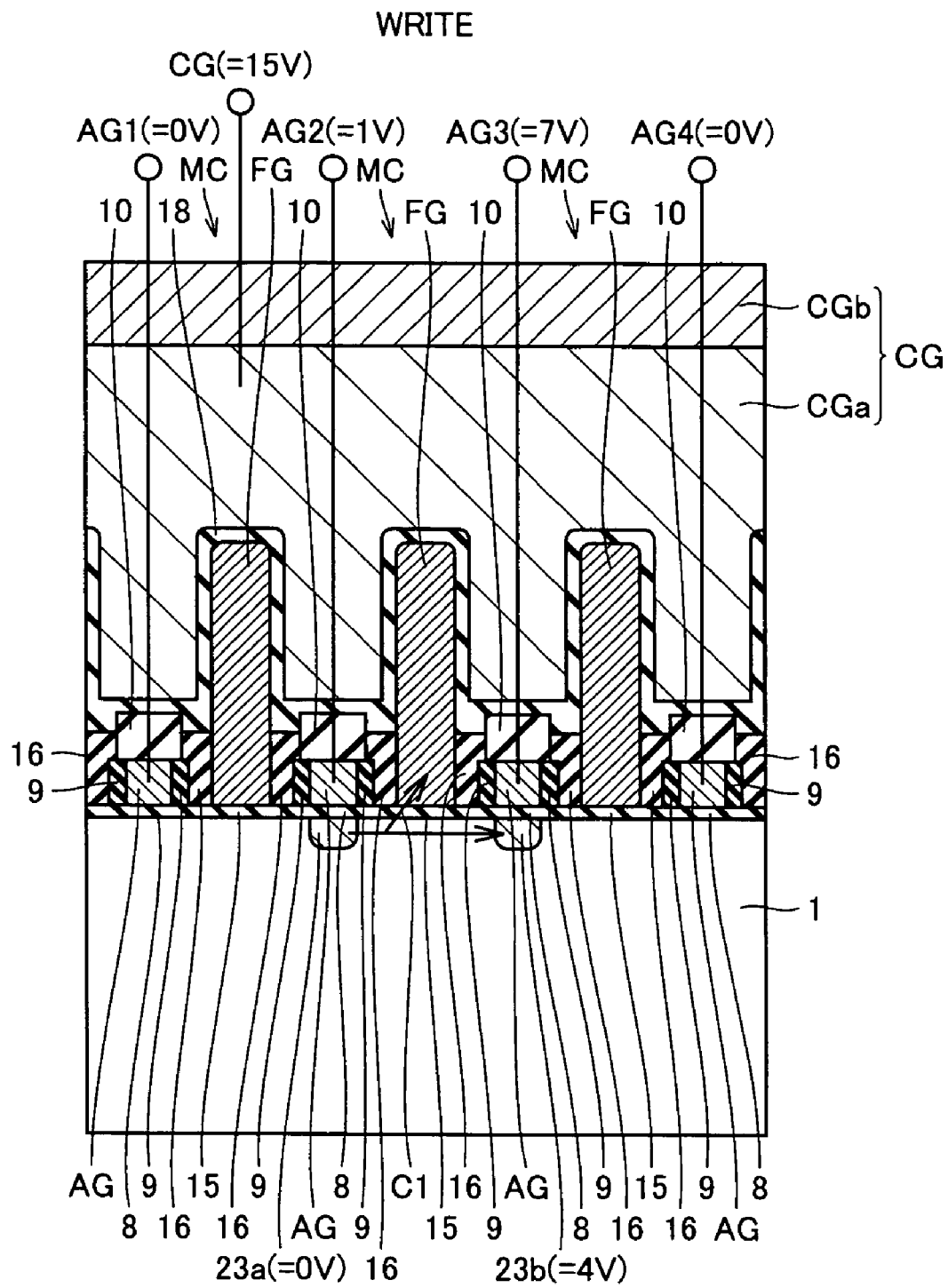
FIG. 4 is a cross-sectional view illustrating a write operation of the nonvolatile semiconductor memory device.

A write operation, a read operation and an erase operation of nonvolatile semiconductor memory device 100 configured as described above are now described. FIG. 4 is a cross-sectional view illustrating the write operation of nonvolatile semiconductor memory device 100. As shown in FIG. 4, to a control gate CG to which a selected memory cell MC is connected, a voltage of approximately 15 V for example is applied and, to other control gates CG, a voltage of approximately 0 V for example is applied. Further, to an assist gate AG2 for forming the source of the selected memory cell MC, a voltage of approximately 1 V for example is applied and, to an assist gate AG3 for forming the drain, a voltage of approximately 7 V for example is applied. To other assist gates AG1, AG4, a voltage of approximately 0 V for example is applied. Accordingly, at the main surface of semiconductor substrate 1 located under assist gate AG2 for forming the source, an n-type inverted layer 23a serving as the source is formed. At the main surface of semiconductor substrate 1 located under assist gate AG3 for forming the drain, an n-type inverted layer 23b serving as the drain is formed. It is noted that the voltage of approximately 0 V is applied to other assist gates AG1, AG4 to prevent any inverted layer from being formed at the main surface of semiconductor substrate 1 under assist gates AG1, AG4. Accordingly, the selected memory cell MC is isolated from non-selected memory cells MC to prevent information from being written into the non-selected memory cells MC.

From inverted layer 23a thus formed to serve as the source, electrons are discharged toward inverted layer 23b serving as the drain to inject electric charge into selected floating gate FG and thereby write information to the selected memory cell MC. Each memory cell MC can store multivalue data. For the multivalue storage, the voltage applied to control gate CG is kept constant while the time for writing is varied so as to vary the amount of hot electrons injected into floating gate FG, and thus memory cell MC having several different threshold levels can be implemented.

Figure 5:
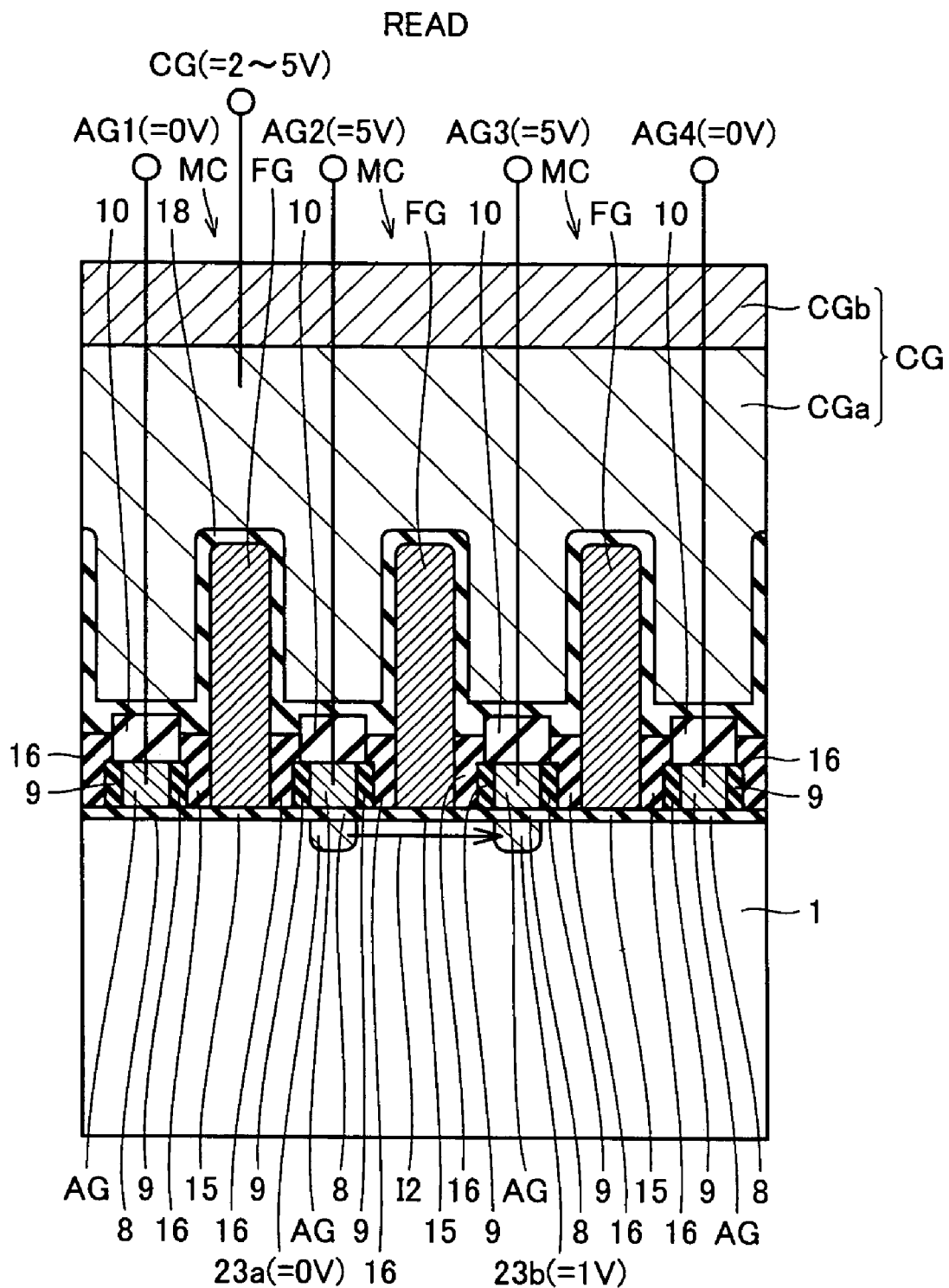
FIG. 5 is a cross-sectional view illustrating a read operation of the nonvolatile semiconductor memory device.

FIG. 5 is a cross-sectional view illustrating the read operation of nonvolatile semiconductor memory device 100. As shown in FIG. 5, in the read operation, to a control gate CG to which a selected memory cell MC is connected, a voltage of approximately 2 V to 5 V for example is applied. To assist gate AG2 that is adjacent to floating gate FG of the selected memory cell MC and used for forming the source, a voltage of approximately 5 V for example is applied. To assist gate AG3 for forming the drain, a voltage of approximately 5 V for example is applied. On the other hand, to other assist gates AG1, AG4, a voltage of approximately 0 V for example is applied.

Accordingly, at the main surface of semiconductor substrate 1 located under assist gate AG2, an inverted layer 23a serving as the source is formed. At the main surface of semiconductor substrate 1 located under assist gate AG3, an inverted layer 23b serving as the drain is formed. To inverted layer 23a thus formed, a voltage of approximately 0 V is applied and, to inverted layer 23b, a voltage of approximately 1 V is applied. On the other hand, at the main surface of semiconductor substrate 1 located under other assist gates AG1, AG4, an inverted layer is prevented from being formed so as to implement isolation. Here, depending on the amount of electric charge stored in the selected floating gate FG, the threshold voltage of the selected memory cell MC varies. Therefore, the electric current flowing between inverted layers 23a and 23b can be sensed to determine information in the selected memory cell MC.

Here, as shown in FIGS. 1 and 3, in this nonvolatile semiconductor memory device 100, air gap GA is formed between floating gates FG adjacent to each other in the direction in which assist gates AG extend. Thus, the capacitance formed between floating gates FG adjacent to each other in the direction in which assist gates AG extend is reduced. Accordingly, even if the amount of electric charge stored in floating gate FG adjacent to the selected floating gate FG in the direction in which assist gates AG extend varies, the influence on the floating gate FG of the selected memory cell MC can be kept small. Thus, variations of the threshold voltage of the selected memory cell MC can be suppressed. In this way, the information stored in the selected memory cell MC can accurately be read.

Figure 6:
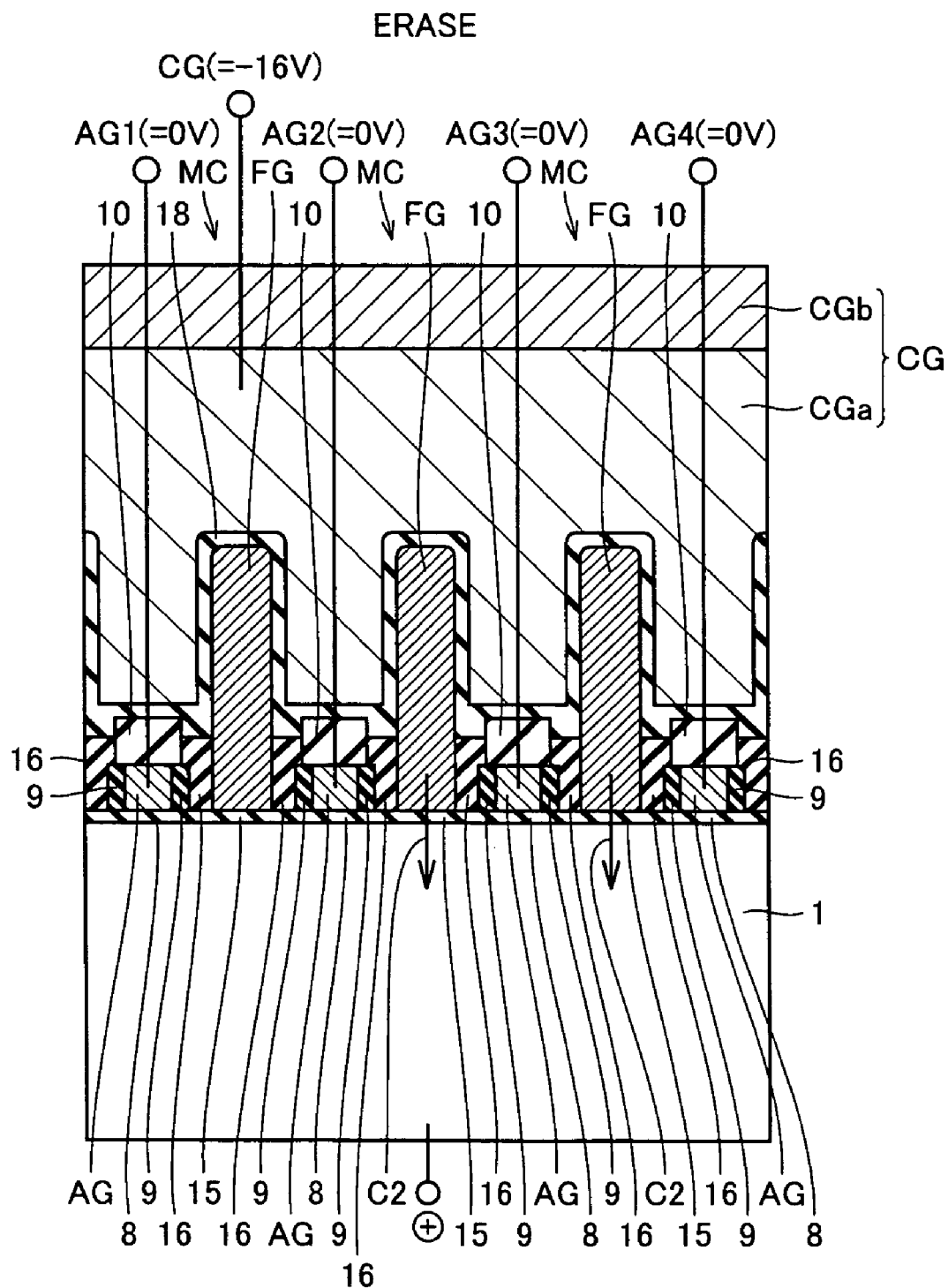
FIG. 6 is a cross-sectional view of the nonvolatile semiconductor memory device in an erase operation.

FIG. 6 is a cross-sectional view of nonvolatile semiconductor memory device 100 in the erase operation. As shown in FIG. 6, in the data erase operation, a negative voltage of approximately −16 V for example is applied to a selected control gate CG while a positive voltage is applied to semiconductor substrate 1. To assist gate AG, a voltage of approximately 0 V is applied to prevent an inverted layer from being formed at the main surface of semiconductor substrate 1. The voltages are thus applied to cause electric charge stored in the floating gate FG connected to the selected control gate CG to be discharged into semiconductor substrate 1 and accordingly information of memory cells MC is erased all together at the same time.

Figure 7:
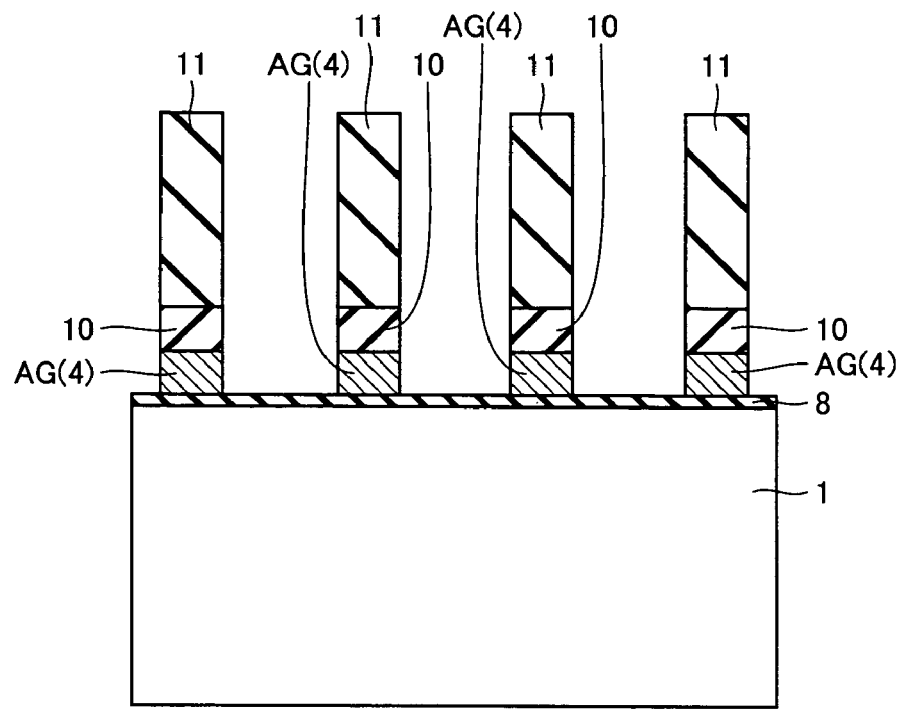
FIGS. 7 to 12 are cross-sectional views illustrating first to sixth steps respectively of a manufacturing process of the nonvolatile semiconductor memory device according to the first embodiment.

With reference to FIGS. 7 to 15, a method of manufacturing nonvolatile semiconductor memory device 100 according to the first embodiment is described. FIG. 7 is a cross-sectional view illustrating a first step of the manufacturing process of nonvolatile semiconductor memory device 100 in the first embodiment. As shown in FIG. 7, normal ion implantation is performed to selectively introduce phosphorus (P) into a memory region of semiconductor substrate 1 and thereby form an n-type embedded region. Thereafter, normal ion implantation is performed to selectively introduce boron (B) for example to a peripheral region of semiconductor substrate 1 and thereby form a p-type well region. Further, into the peripheral circuit region of semiconductor substrate 1, phosphorus for example is selectively introduced to form an n-type well region.

Further, on the main surface of semiconductor substrate 1, insulating film 8 made for example of silicon oxide is formed to a thickness of approximately 8.5 nm in terms of the thickness of silicon dioxide film, by means of such a thermal oxidation method as ISSG (In-Situ Steam Generation) oxidation method, and thereafter an electrically conductive film 4 made for example of low-resistance polycrystalline silicon is deposited to a thickness of approximately 50 nm for example by means of such a method as CVD (Chemical Vapor Deposition). Further, on this film, insulating film 10 made for example of silicon nitride is deposited to a thickness of approximately 70 nm for example by means of such a method as CVD. Subsequently, on insulating film 10, an insulating film (third insulating film) 11 made for example of silicon oxide is deposited by such a method as CVD using TEOS (Tetraethoxysilane) gas for example and thereafter patterning is carried out. Thus, on the main surface of semiconductor substrate 1, a plurality of assist gates AG spaced from each other, insulating film 10 on the top surface of assist gates AG and insulating film 11 on the top surface of insulating film 10 are formed.

Figure 8:
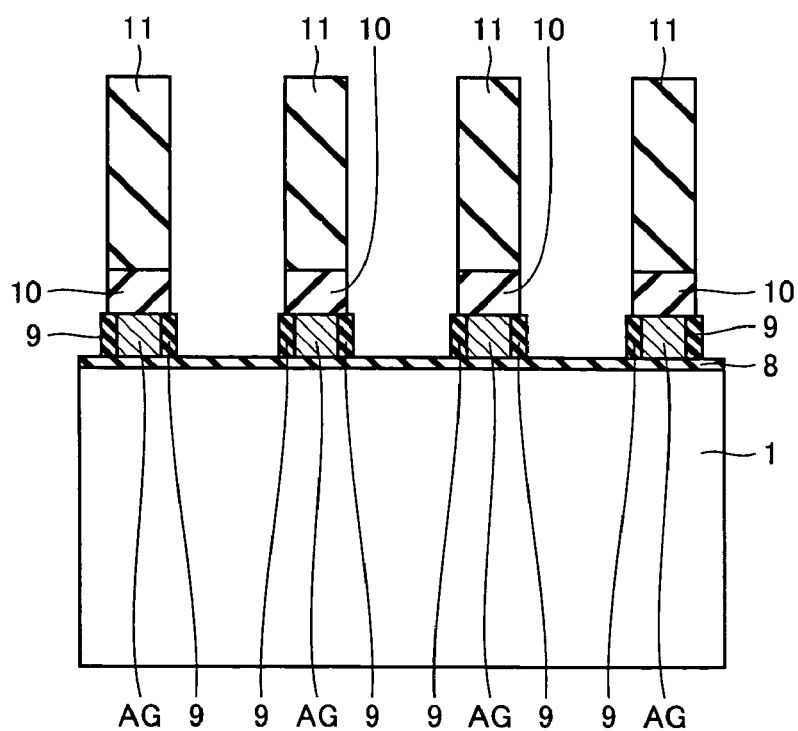
Figure 9:
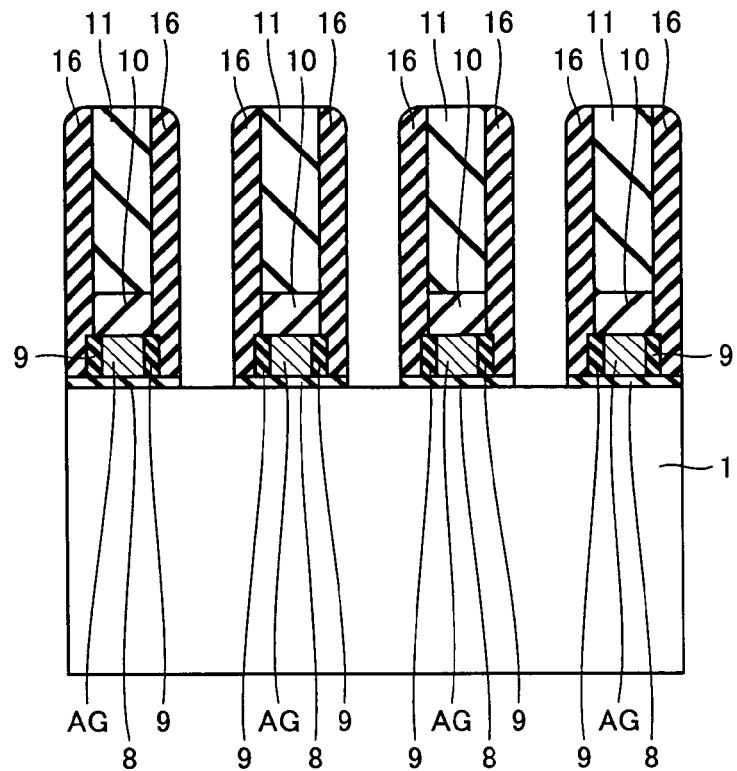
Figure 10:
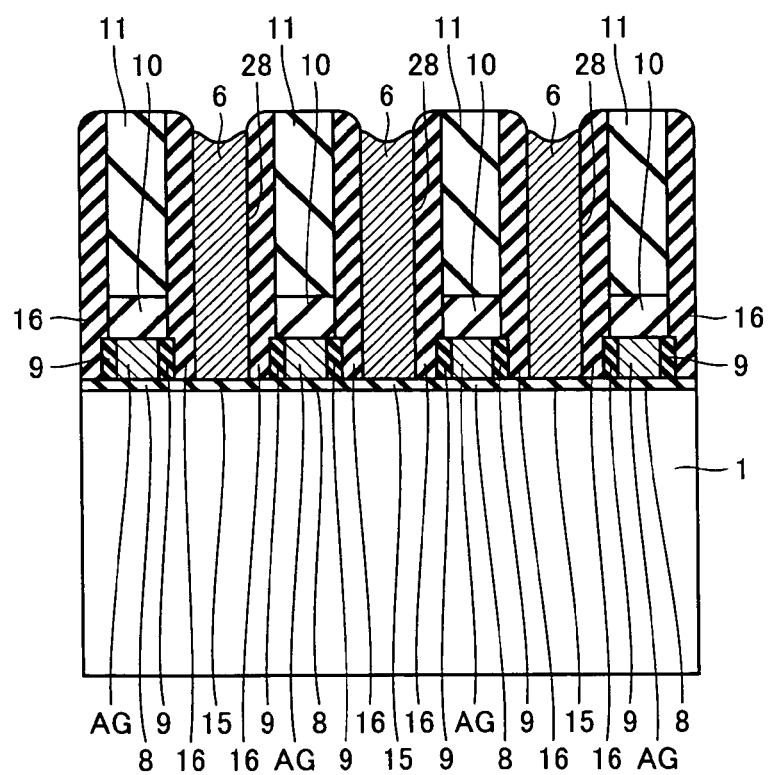

FIGS. 8 to 10 are cross-sectional views illustrating second to fourth steps respectively. As shown in FIG. 8, thermal oxidation is used to form insulating film 9 on the side surface of assist gate AG. Then, as shown in FIG. 9, insulating film 16 is deposited and then dry-etched to form insulating film 16 in the form of the side wall on respective side surfaces of insulating film 11, insulating film 10 and insulating film 9. At this time, a portion of the main surface of semiconductor substrate 1 that is located between the sidewall portions of insulating film 16 is exposed. Then, as shown in FIG. 10, on the main surface of semiconductor substrate 1 that is located between the sidewall portions of insulating film 16, insulating film 15 is formed. Thereafter, on the main surface of semiconductor substrate 1 that is located between the sidewall portions of insulating film 16, an electrically conductive film 6 is deposited.

Figure 11:
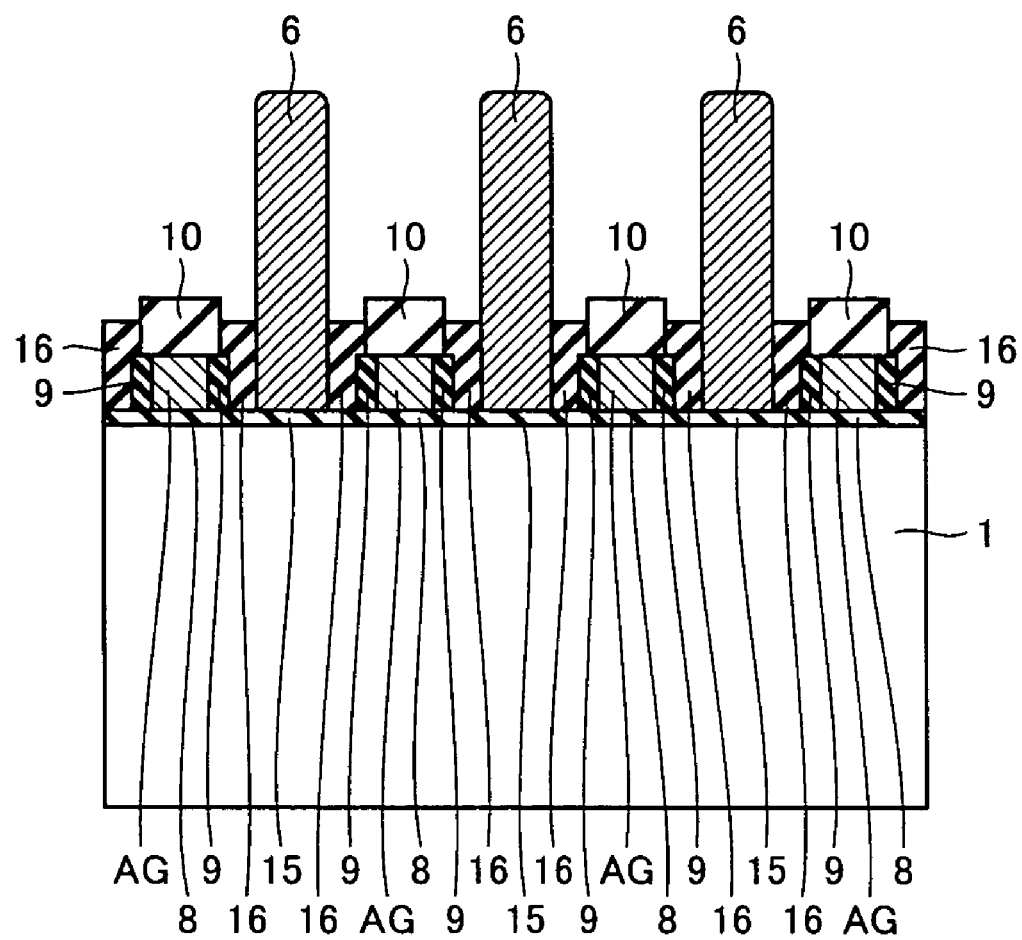
Figure 12:
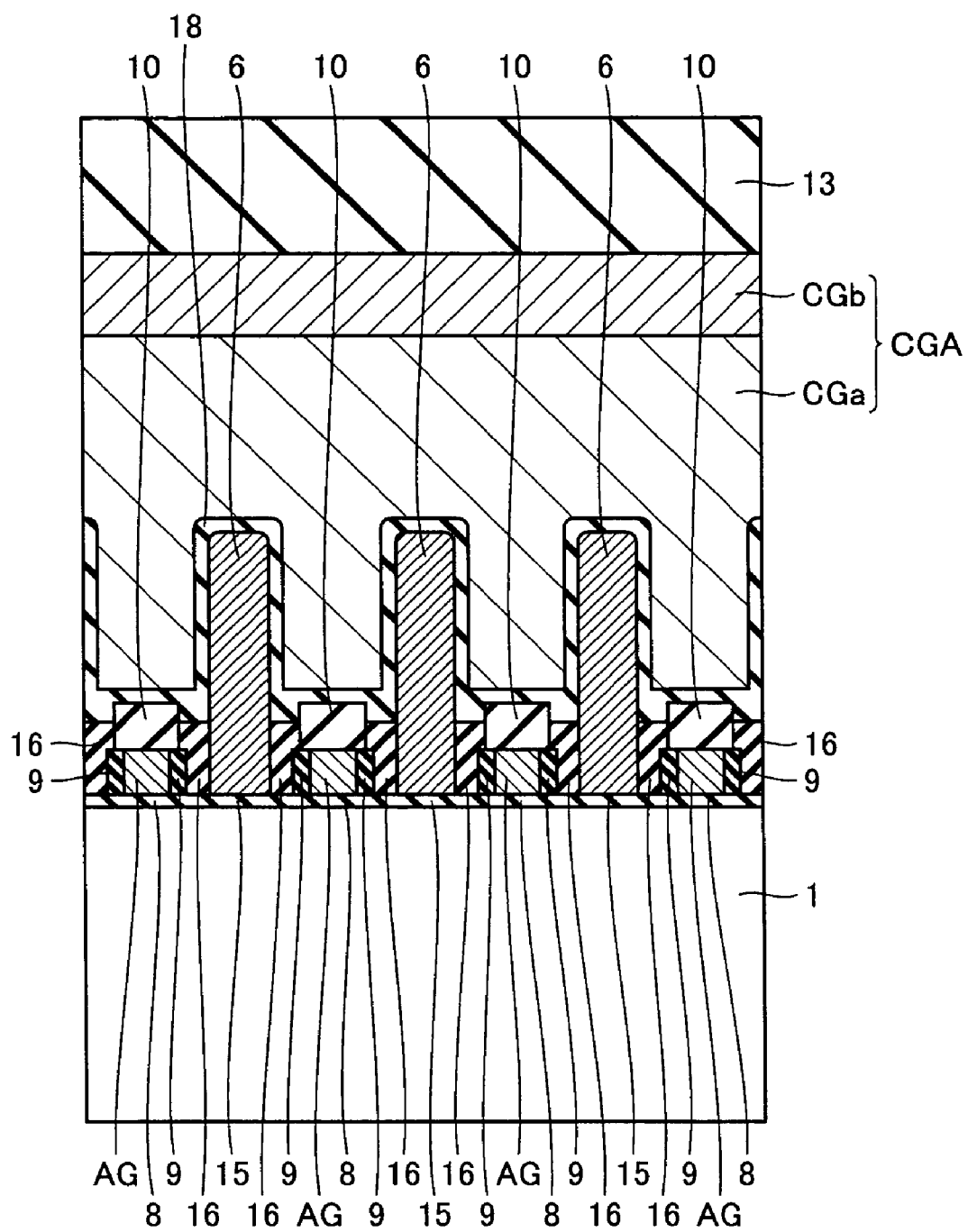

FIGS. 11 and 12 are cross-sectional views illustrating fifth and sixth steps respectively. As shown in FIG. 11, insulating film 10 is used as a stopper to dry-etch insulating film 16 shown in FIG. 10 and thereby expose most of conductive film 6. Then, as shown in FIG. 12, on the surface of conductive film 6 located at a higher level than insulating film 16, insulating film 18 is formed. On the top surface of insulating film 18, conductive film CGa of polycrystalline silicon and conductive film CGb of such a refractory metal silicide film as tungsten silicide ($WSi_x$) are successively deposited. On the top surface of conductive film CGb, an insulating film 13 is formed. It is noted here that conductive films CGa and CGb are not limited to the above-described ones. Conductive film CGa may be of a material having a weaker ionization tendency than conductive film CGb.

Figure 13:
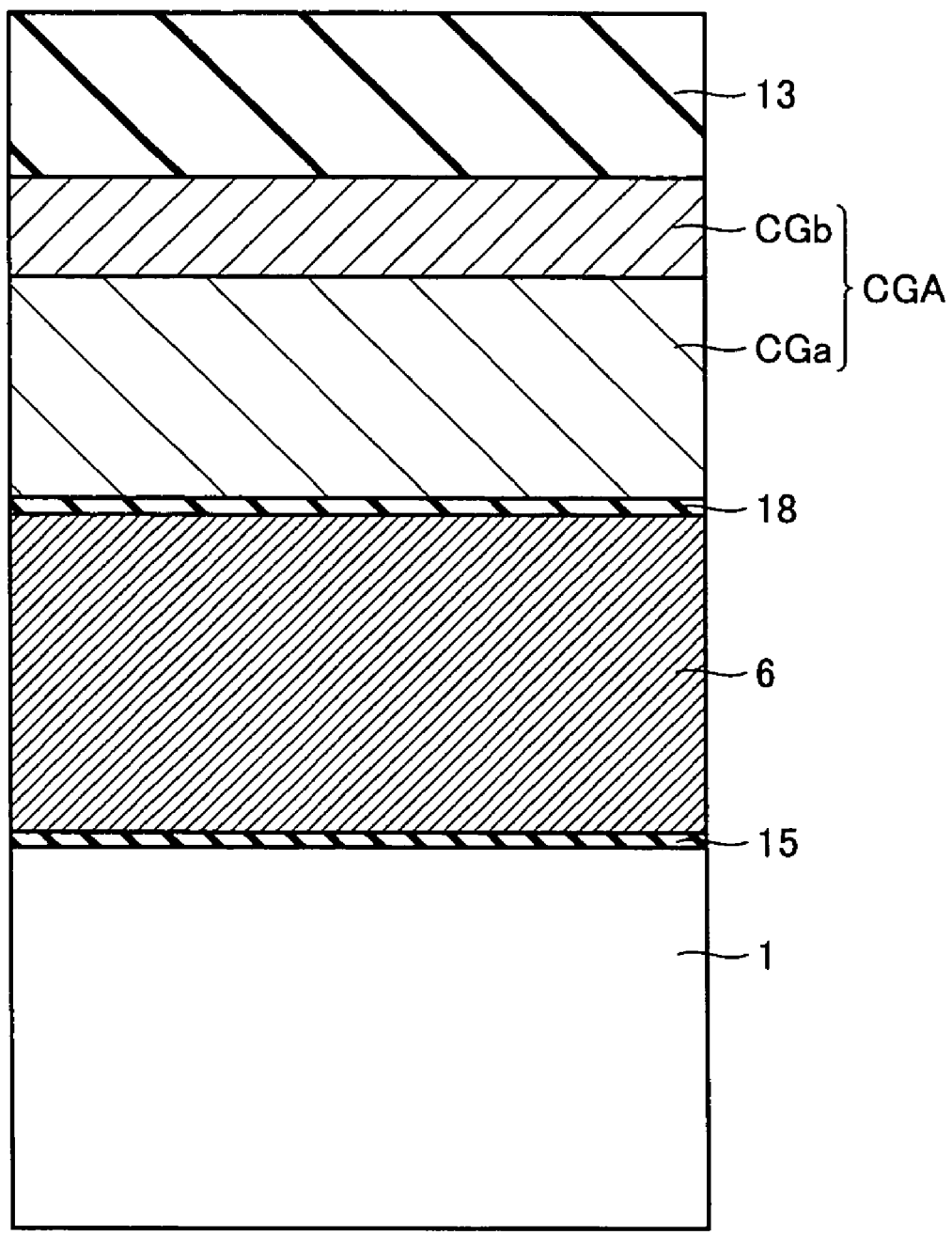
FIG. 13 is a cross-sectional view of a portion along assist gates AG shown in FIG. 1 and between assist gates AG formed in the sixth step.
Figure 14:
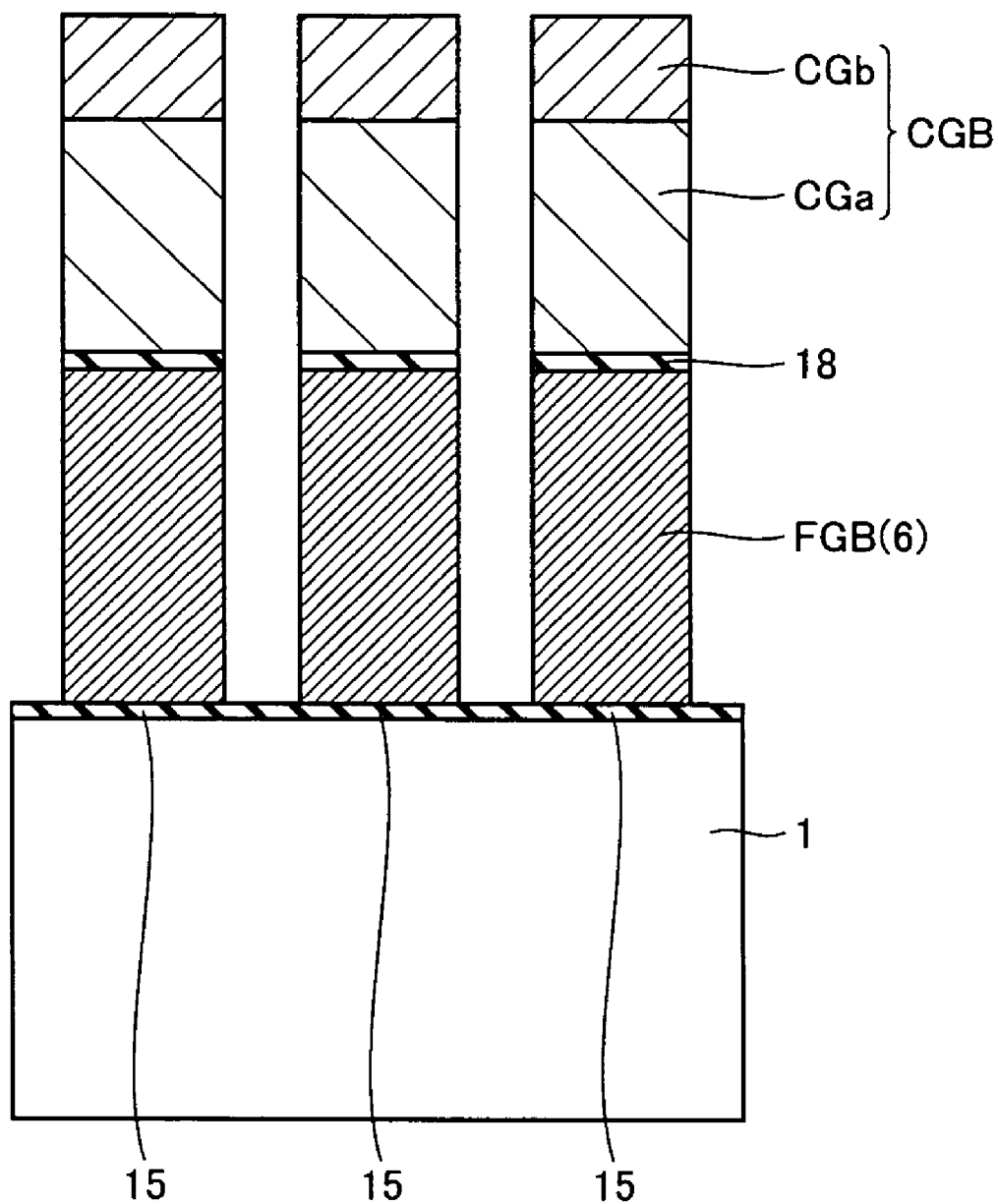
FIGS. 14 and 15 are cross-sectional views illustrating seventh and eighth steps respectively of the manufacturing process of the nonvolatile semiconductor memory device according to the first embodiment.
Figure 15:
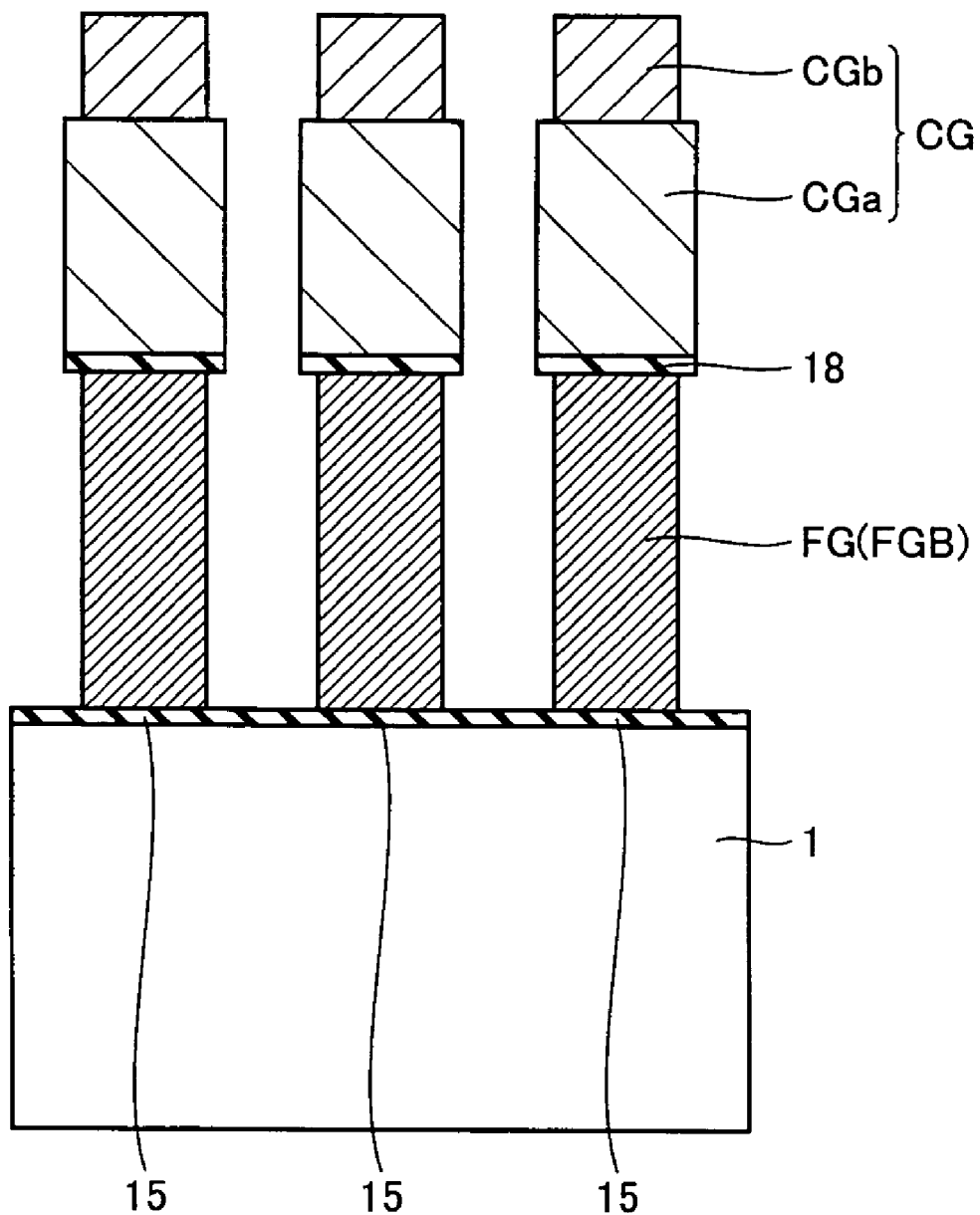

FIG. 13 is a cross-sectional view of a portion along assist gates AG shown in FIG. 1 and between assist gates AG formed in the above-described sixth step. As shown in FIG. 13, in the sixth step, conductive film 6 extends in the direction parallel with the main surface of semiconductor substrate 1. FIGS. 14 and 15 are cross-sectional views illustrating seventh and eighth steps respectively, showing a portion along assist gates AG and between assist gates AG. As shown in FIG. 14, conductive films CGb, CGa, 6 and insulating film 18 are patterned to form a conductive-film pattern FGB of the floating gate and a conductive film pattern CGB of the control gate formed on the top surface of conductive film pattern FGB. Conductive film pattern CGB includes conductive film CGa and conductive film CGb that is in contact with conductive film CGa and that is formed on the top surface of conductive film CGa. Between conductive film patterns CGB and FGB, insulating film 18 is formed. Then, as shown in FIG. 15, conductive film pattern FGB and conductive film pattern CGB are wet-etched with a higher etch selectivity with respect to the oxide film. It is noted that hot water treatment may be used instead of the wet etching.

Here, since conductive film CGb has a stronger ionization tendency than conductive film CGa and conductive films CGa and CGb are in contact with each other, an oxidation-reduction reaction occurs between a chemical solution and conductive film CGb in the wet etching process so that conductive film CGb is etched to be reduced in film size in the direction parallel with the main surface of semiconductor substrate 1. Electrons in conductive film CGa move to conductive film CGb so that an oxidation-reduction reaction between conductive film CGa and the chemical solution is retarded and etching of conductive film CGa is suppressed. On the other hand, since insulating film 18 is formed between conductive film pattern FGB and conductive film pattern CGB, it is unlikely that electrons move from conductive film pattern FGB to conductive film pattern CGB so that conductive film pattern FGB is etched to be reduced in film size in the direction parallel with the main surface of semiconductor substrate 1.

In other words, the degree by which conductive film pattern FGB is reduced in film size in the direction parallel with the main surface of semiconductor substrate 1 is larger than the degree by which conductive film CGa is reduced in film size in the direction parallel with the main surface of semiconductor substrate 1. Further, the degree by which conductive film CGb is reduced in film size in the direction parallel with the main surface of semiconductor substrate 1 is larger than the degree by which conductive film CGa is reduced in film size in the direction parallel with the main surface of semiconductor substrate 1.

In the eighth step, as shown in FIGS. 12, 14 and 15, the side surfaces of conductive film pattern FGB that are opposite to each other in the direction in which conductive film pattern CGB extends are covered with insulating film 18. Therefore, the side surfaces of conductive film pattern FGB that extend in the direction crossing the direction in which control gate CG as formed extends are etched. Accordingly, the width of conductive film pattern FGB in the direction crossing the direction in which control gate CG as formed extends is decreased, while the width of conductive film pattern FGB in the direction in which control gate CG extends is maintained. Since insulating film 18 is not etched and conductive film CGa is not substantially etched, insulating film 18 remains on the bottom surface of conductive film CGa.

As described above, conductive film pattern FGB is reduced in film size in the direction parallel with the main surface of semiconductor substrate 1, while conductive film CGa is not substantially reduced in film size. Accordingly, control gate CG as formed has wider portion 28 formed to protrude, with respect to floating gate FG as formed, in the direction parallel with the main surface of semiconductor substrate 1. Further, insulating film 18 that is almost equal in width to wider portion 28 remains on the bottom surface of wider portion 28. Thus, insulating film 18 and conductive film CGa form overhang portion 38 that protrudes, with respect to floating gate FG, in the direction parallel with the main surface of semiconductor substrate 1.

Then, as shown in FIG. 3, interlayer insulating layer 17 is formed by plasma CVD or HDP (High-Density Plasma). Gap-filling conditions of the HDP are set for example to Ar: 150 sccm, $O_2$: 150 sccm, $SiH_4$: 80 sccm, LF-RF: 3600 W (900+2700), and HF-RF: 2000W.

Under the above-described conditions, coverage can be deteriorated and gap-filling capability can be lowered. Thus, filling of the space between floating gates FGa and FGb with interlayer insulating film 17 is retarded while formation of air gap GA is facilitated. In particular, since overhang portions 38a, 38b including wider portions 28a, 28b are formed on the top surface of floating gates FGa, FGb, interlayer insulating film 17 is hindered from entering the portion under overhang portions 38a, 38b.

Since the distance between overhang portions 38a and 38b that is in parallel with the main surface of semiconductor substrate 1 is smaller than the distance between floating gates FGa and FGb, the space between overhang portions 38a and 38b is filled with interlayer insulating film 17 at an early stage so that the space between overhang portions 38a and 38b is closed. Thus, the space between floating gates FGa and FGb on the main surface of semiconductor substrate 1 is prevented from being filled with interlayer insulating film 17 and thus interlayer insulating film 17 is prevented from being formed on the side surfaces of floating gates FGa, FGb. Moreover, since the space between overhang portions 38a and 38b is closed at an early stage, air gap GA is formed between floating gates FGa and FGb. In addition, since overhang portions 38a, 38b are formed directly on floating gates FGa, FGb, air gap GA is prevented from extending between control gates CG1 and CG2 and extending to a higher level than control gates CG1, CG2.

Since the space between control gates CG1 and CG2 is filled with interlayer insulating film 17, it can be prevented that air gap GA is formed in the top surface of interlayer insulating film 17. Thus, in a subsequent cleaning process, a cleaning fluid can be prevented from entering air gap GA.

As seen from the above, interlayer insulating film 17 may be deposited to the level of the top surface of control gates CG1, CG2, the thickness of interlayer insulating film 17 can be prevented from excessively increasing. Thus, a contact hole can appropriately be formed in interlayer insulating film 17 in the process of forming a contact portion with which a voltage is applied to assist gate AG shown in FIG. 1 and to an inverted layer formed at the main surface of the semiconductor substrate that is located under assist gate AG.

The distance between conductive films CGa2 and CGb2 is made larger than the distance between overhang portions 38a and 38b. Therefore, the space between conductive films CGa2 and CGb2 is appropriately filled with interlayer insulating film 17 and a seam is unlikely to be formed. Even if a seam is formed in interlayer insulating film 17 that fills the space between overhang portions 38a and 38b, the seam is prevented from extending to the portion between conductive films CGa2 and CGb2. Through the process steps as described above, nonvolatile semiconductor memory device 100 is manufactured.

It is noted that, while the first embodiment has been described as the one applied to AG-AND type flash memory, the first embodiment is not limited to this.

Figure 33:
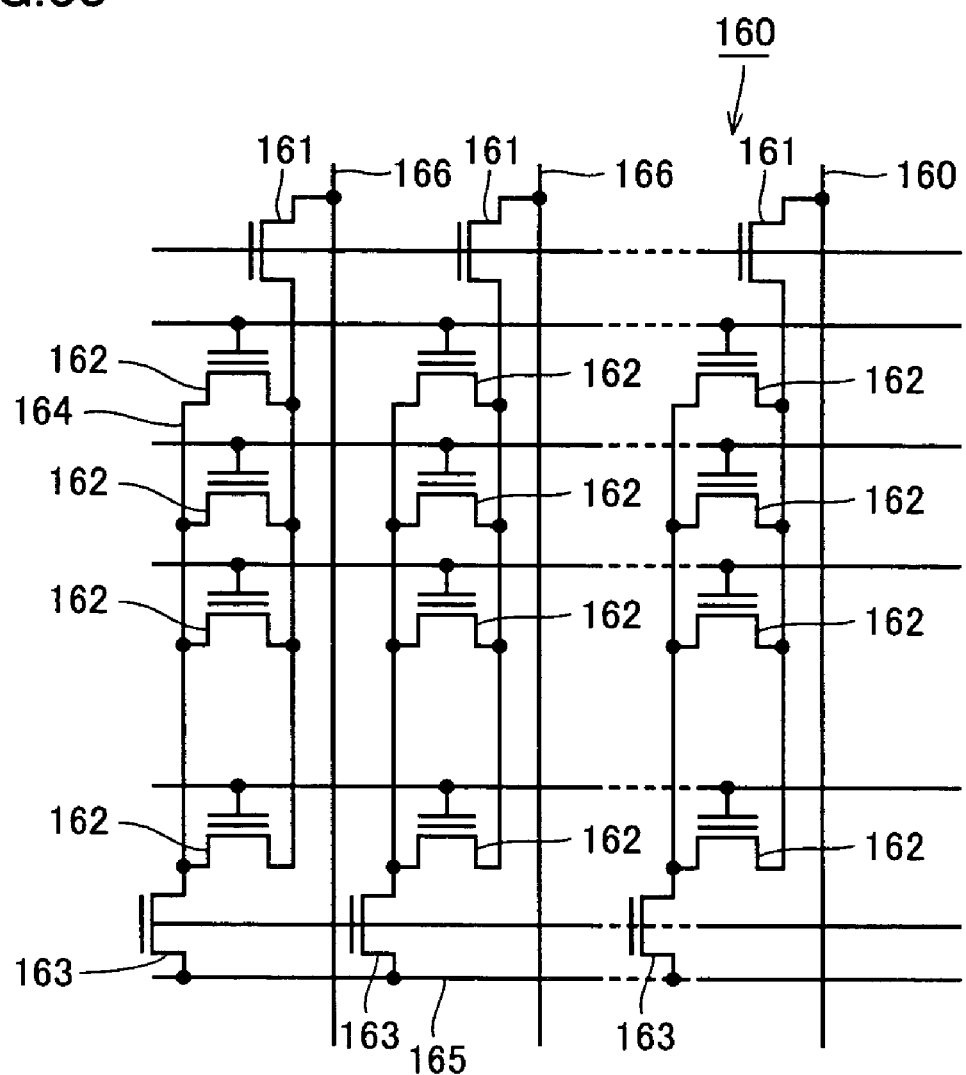
FIG. 33 is a circuit diagram showing a general AND-type flash array configuration.
Figure 34:
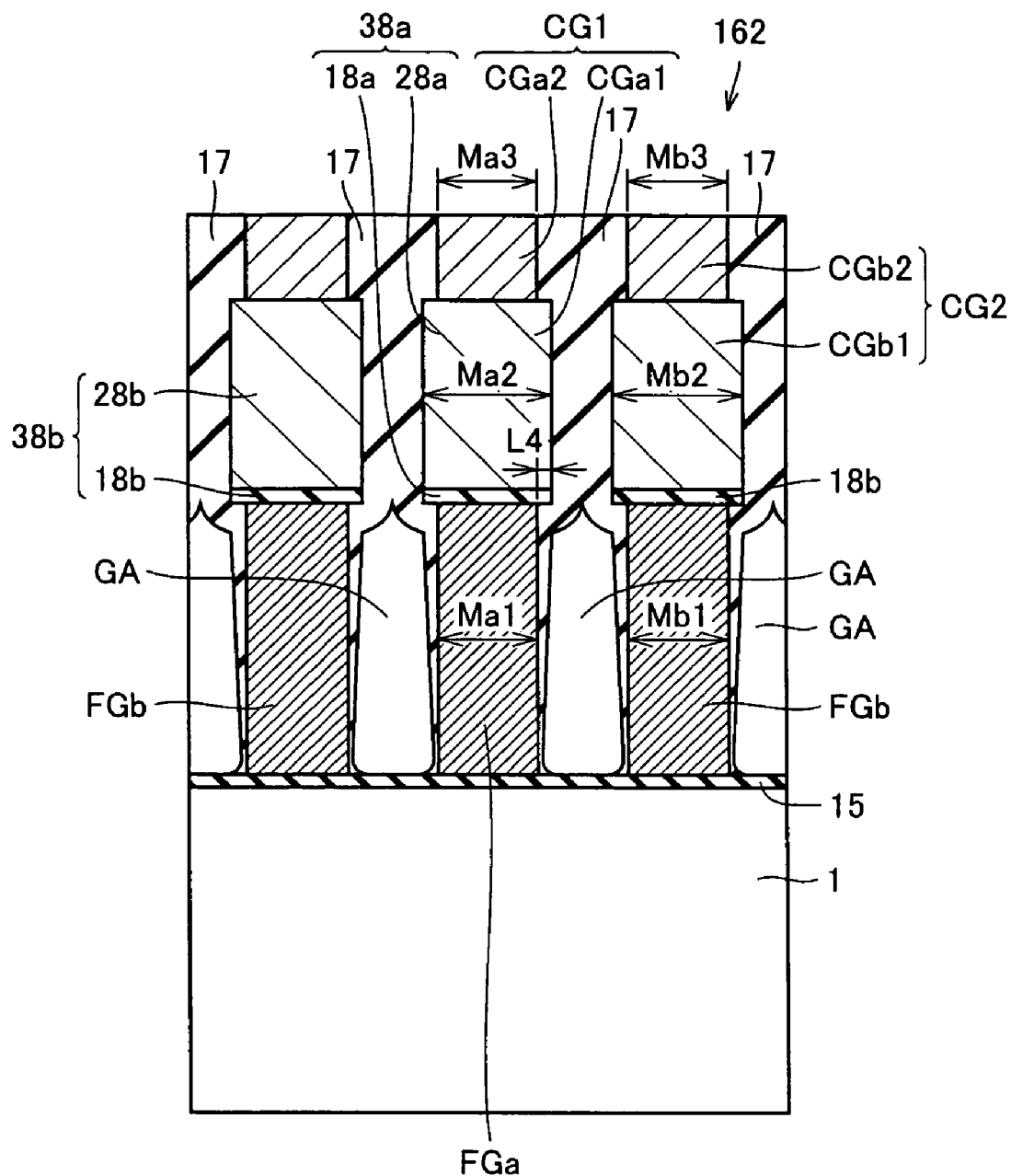
FIG. 34 is a cross-sectional view of a memory cell transistor.

FIG. 33 is a circuit diagram showing a general AND-type flash array configuration. As shown in FIG. 33, general AND-type flash array configuration 160 includes a plurality of memory cell transistors 162 connected by word lines 164, a select transistor 161 connected to a main bit line 166 and a select transistor 163 connected to a source line. FIG. 34 is a cross-sectional view of memory cell transistor 162. As shown in FIG. 34, memory cell transistor 162 has an air gap GA formed between floating gates FGa and FGb. With general AND-type flash array configuration 160 thus formed, the capacitance formed between floating gates FGa and FGb can be reduced and variations in threshold voltage can be suppressed.

Figure 35:
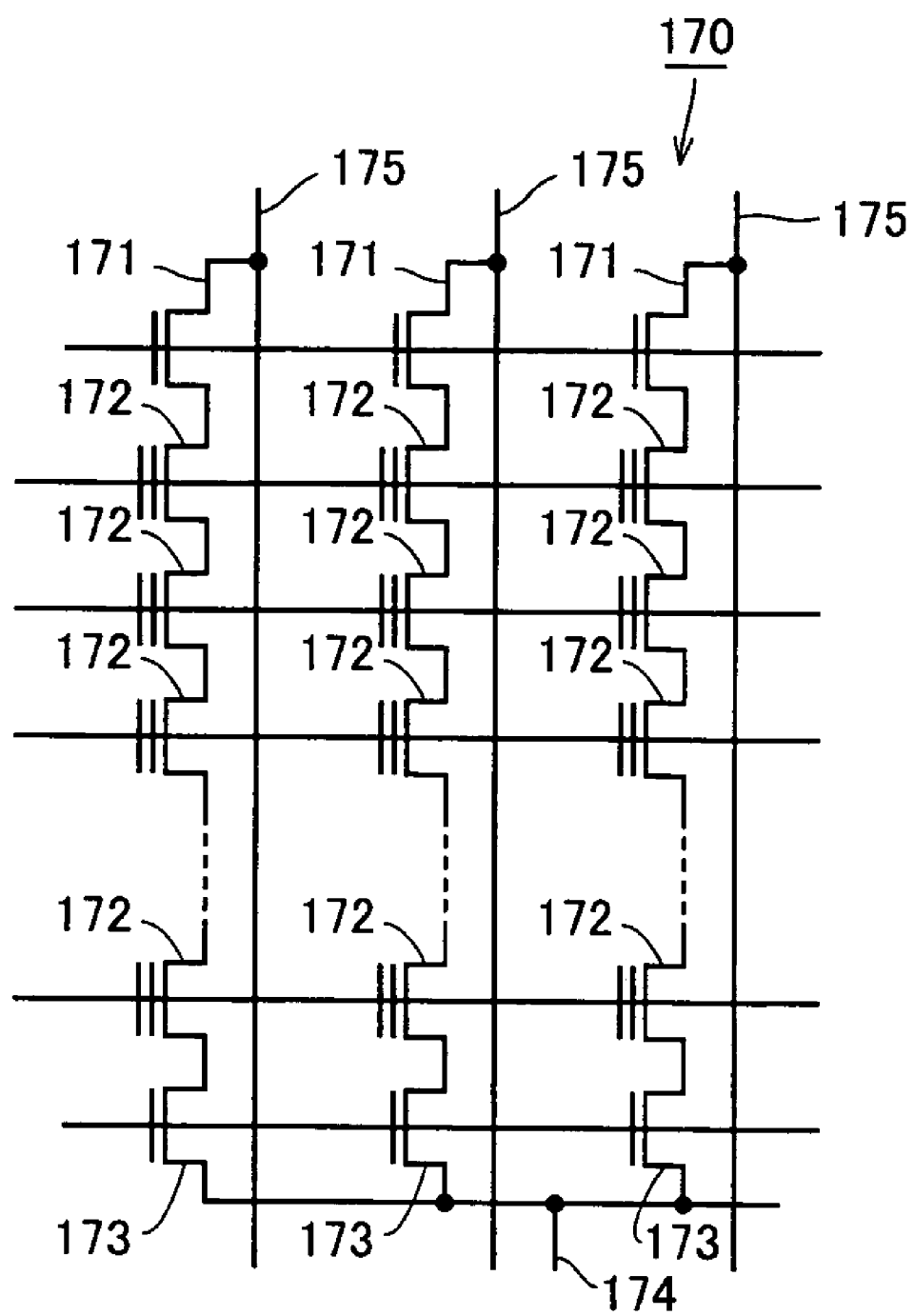
FIG. 35 is a circuit diagram showing a general NAND-type flash array configuration.
Figure 36:
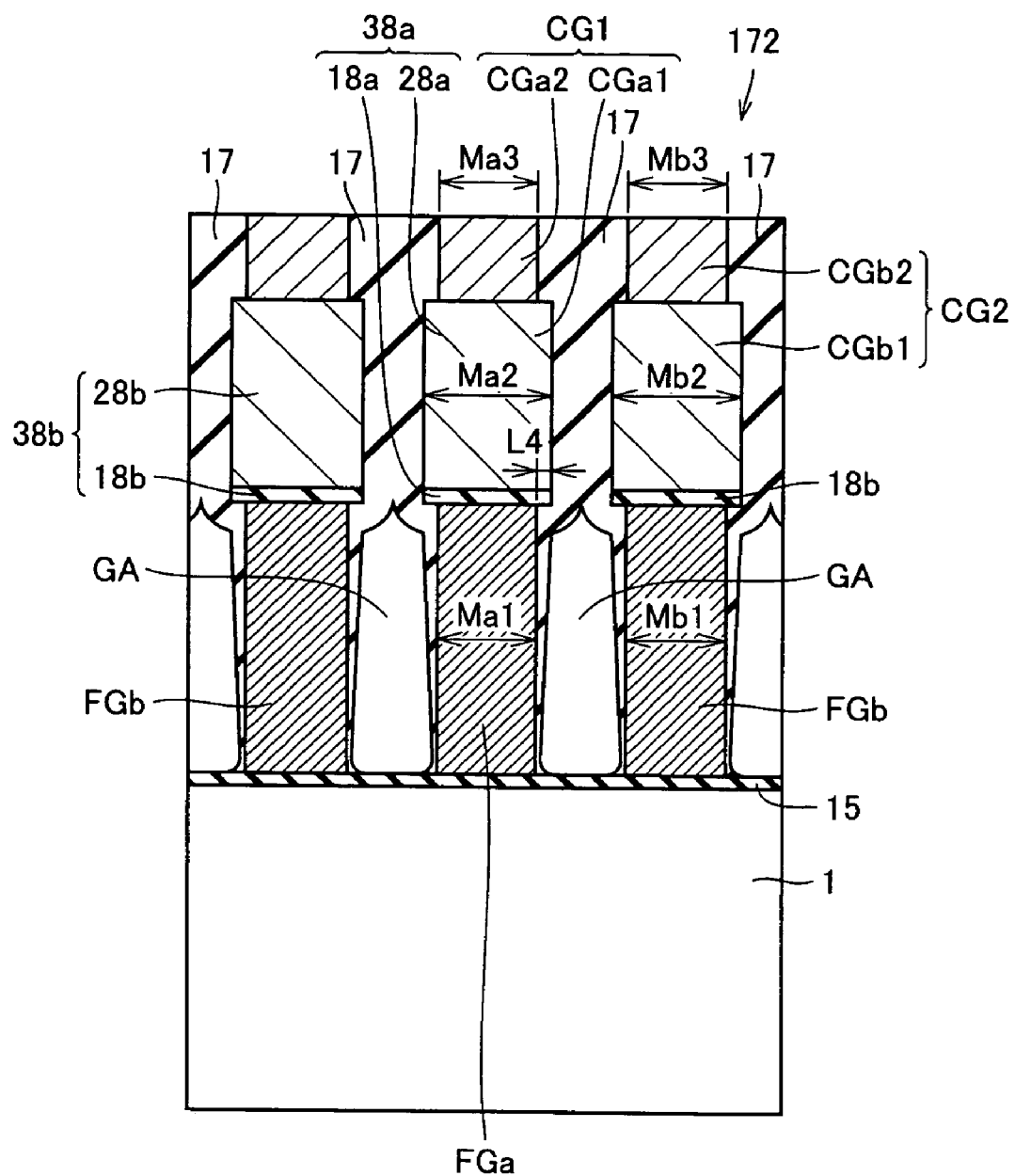
FIG. 36 is a detailed cross-sectional view of a memory cell transistor.

FIG. 35 is a circuit diagram showing a general NAND-type flash array configuration 170. As shown in FIG. 35, NAND-type flash array configuration 170 includes a plurality of select transistors 171 connected respectively to bit lines 175, select transistors 173 connected to a source line and a plurality of memory cell transistors 172 disposed between each select transistor 171 and each select transistor 173. FIG. 36 is a detailed cross-sectional view of memory cell transistor 172. As shown in FIG. 36, memory cell transistor 172 has an air gap GA between floating gates FGa and FGb. With NAND-type flash array configuration 170 thus formed, the capacitance formed between floating gates FGa and FGb can be reduced. Moreover, effects similar to those of nonvolatile semiconductor memory device 100 in the first embodiment can be achieved.

In addition, air gap GA formed between floating gates FGa and FGb to reduce the capacitance between floating gates FGa and FGb is applicable as well to an NOR-type flash array configuration.

Second Embodiment

Figure 16:
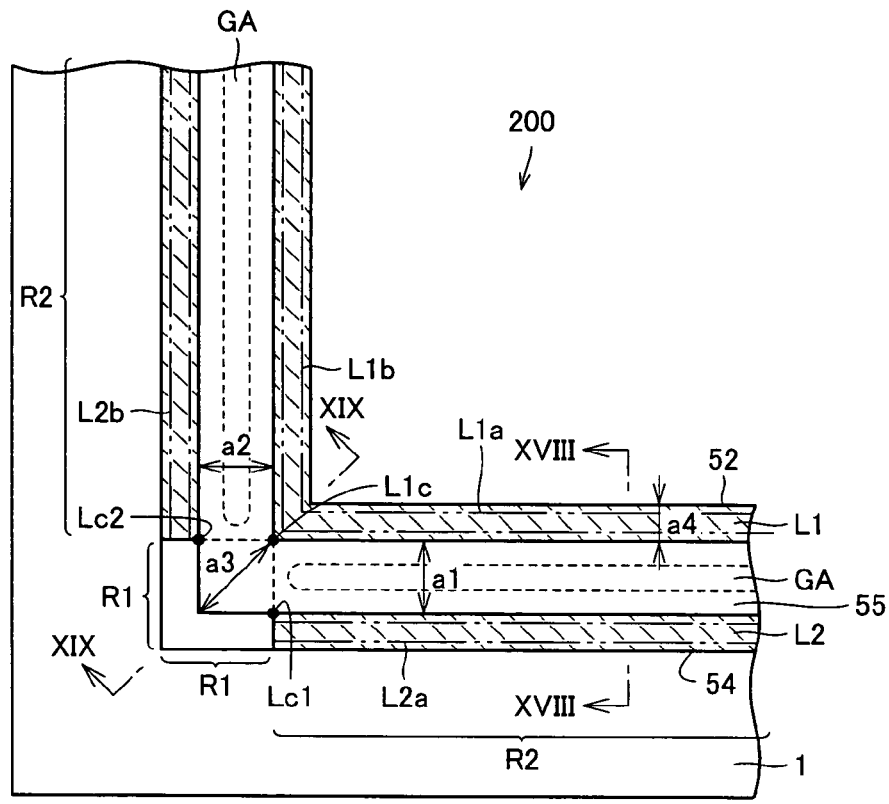
FIG. 16 is a plan view of a semiconductor device according to a second embodiment.

With reference to FIGS. 16 to 32, a semiconductor device 200 according to a second embodiment is described. FIG. 16 is a plan view of semiconductor device 200 according to the second embodiment. As shown in FIG. 16, semiconductor device 200 includes a semiconductor substrate 1, an interconnect line L1 formed on a main surface of semiconductor substrate 1 and an interconnect line L2 extending along interconnect line L1.

Interconnect line L1 includes a linear portion L1a extending in the same single direction and a linear portion L1b extending from a bent portion L1c in the direction orthogonal to linear portion L1a, and is thus formed in the shape of L.

On the top surface of interconnect line L1, an electrically conductive film 52 is formed. Conductive film 52 has its width a4 that is in the direction orthogonal to the direction in which interconnect line L1 extends and that is made larger than the width of interconnect line L1. Further, interconnect line L2 includes a linear portion L2a extending along linear portion L1a and a linear portion L2b extending from a bent portion in the direction orthogonal to linear portion L2a, and is thus formed in the shape of L.

Interconnect line L2 includes a portion located between an intersection point Lc1 between a normal line extending from bent portion L1c to linear portion L2a and linear portion L2a and an intersection point Lc2 between a normal line extending from bent portion L1c to linear portion L2b and linear portion L2b, and a distance a3 between this portion of interconnect line L2 and bent portion L1c of interconnect line L1 is made larger than a predetermined distance of 90 nm. Further, on the main surface of semiconductor substrate 1 located in the region surrounded by the aforementioned portion of interconnect line L2 between intersection points Lc1 and Lc2 and by bent portion L1c, insulating film 55 is deposited.

Interconnect line L2 also includes portions except for the portion between intersection points Lc1 and Lc2, and respective distances a1 and a2 between these portions and interconnect line L1 are approximately equal to the predetermined distance of 90 nm. On respective top surfaces of the portions except for the portion between intersection points Lc1 and Lc2 of interconnect line L2, an electrically conductive film 54 is formed. Here, the portion of interconnect line L2 that is located between intersection points Lc1 and Lc2 has its width, which is orthogonal to the direction in which interconnect line L2 extends, and this width is made larger than the width, which is orthogonal to the direction in which interconnect line L2 extends, of the portions except for the portion between intersection points Lc1 and Lc2 of interconnect line 2. In insulating film 55 formed on the main surface of semiconductor substrate 1 located in the region between interconnect line L1 and the portions except for the portion between intersection points Lc1 and Lc2 of interconnect line L2, air gap GA is formed.

Figure 17:
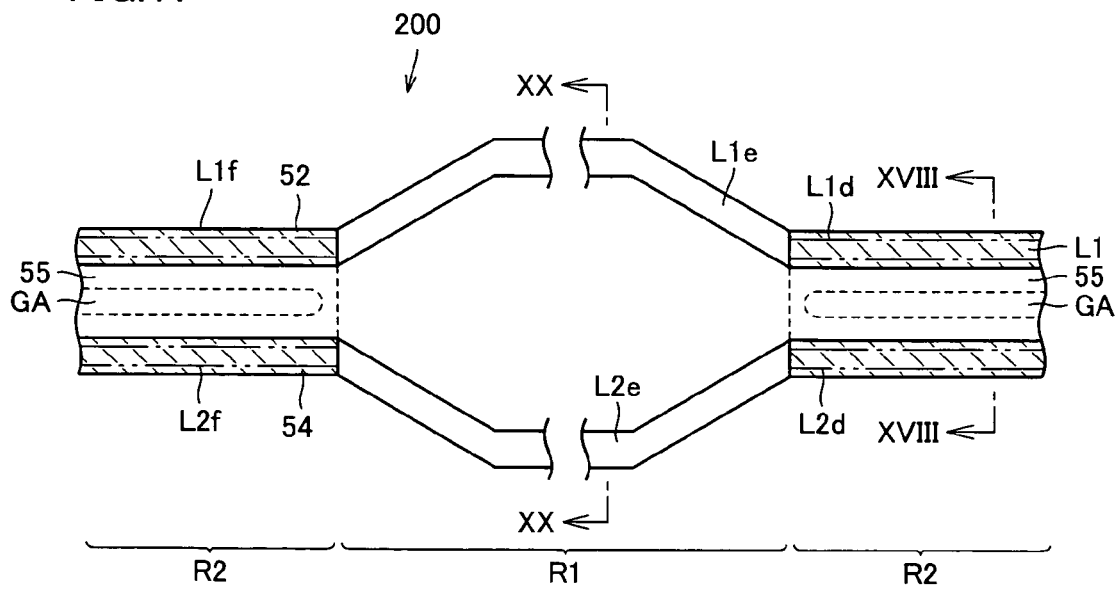
FIG. 17 is a plan view of a region different from the region shown in FIG. 16.

FIG. 17 is a plan view of semiconductor device 200 showing a region different from the region shown in FIG. 16. Interconnect line L1 includes a linear portion L1d, a linear portion L1f spaced apart from linear portion L1d and a curved portion L1e connecting linear portions L1d and L1f and curved in the direction away from interconnect line L2. Interconnect line L2 includes a linear portion L2d spaced by a predetermined distance from linear portion L1d and extending along linear portion L1d, a linear portion L2f spaced by a predetermined distance from linear portion L1f and extending along linear portion L1f, and a curved portion L2e spaced by a predetermined distance from curved portion L1e and curved in the direction away from curved portion L1e.

Regarding interconnect line L1, on respective top surfaces of linear portion L1d and linear portion L1f, conductive film 52 is formed, while conductive film 52 is not formed on the top surface of curved portion L1e. Curved portion L1e is larger in width than linear portions L1d, L1f. Regarding interconnect line L2, on respective top surfaces of linear portion L2d and linear portion L2f, conductive film 54 is formed, while conductive film 54 is not formed on the top surface of curved portion L2e. Curved portion L2e is larger in width than linear portions L2d and L2f.

In other words, as shown in FIGS. 16 and 17, there are a region R1 where the distance between interconnect line L1 and interconnect line L2 is at least a predetermined distance, and a region R2 where the distance between interconnect line L1 and interconnect line L2 is the predetermined distance or at most the predetermined distance. In region R2, on the top surface of interconnect line L1, conductive film 52 is formed and, on the top surface of interconnect line L2, conductive film 54 is formed. Further, in region R2, in insulating film 55 filling the space between interconnect line L1 and interconnect line L2, air gap GA is formed. In region R1, the space between interconnect line L1 and interconnect line L2 is filled with insulating film 55. Further, in region R1, on respective top surfaces of interconnect line L1 and interconnect line L2, conductive films 52 and 54 are not formed. Moreover, respective widths of interconnect line L1 and interconnect line L2 in region R1 are made larger than those of interconnect line L1 and interconnect line L2 in region R2.

Figure 18:
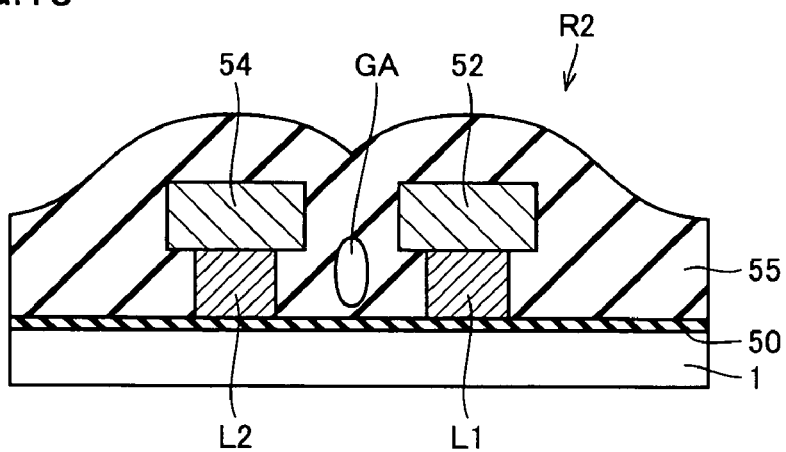
FIG. 18 is a cross-sectional view along line XVIII-XVIII in FIG. 16.
Figure 19:
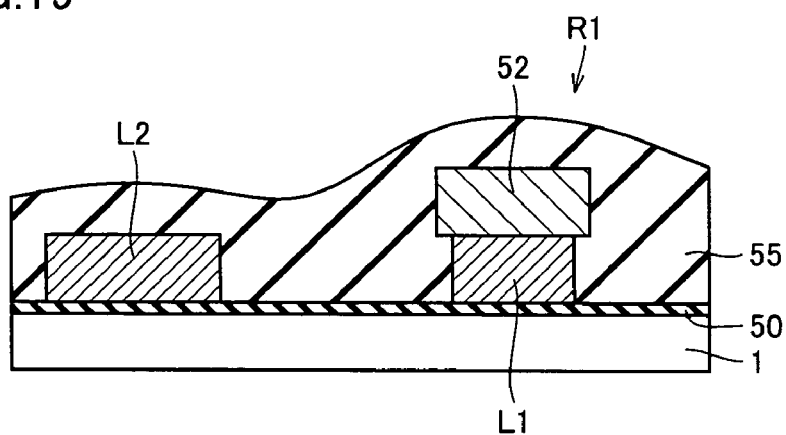
FIG. 19 is a cross-sectional view along line XIX-XIX in FIG. 16.
Figure 20:
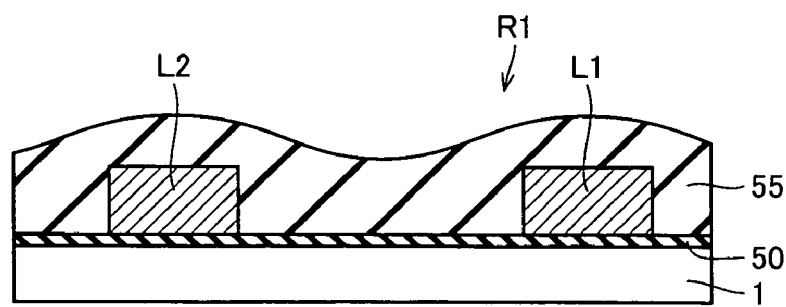
FIG. 20 is a cross sectional view along line XX-XX in FIG. 17.

FIG. 18 is a cross-sectional view along line XVIII-XVIII in FIG. 16, FIG. 19 is a cross-sectional view along line XIX-XIX in FIG. 16 and FIG. 20 is a cross-sectional view along line XX-XX in FIG. 17.

As shown in FIG. 18, semiconductor device 200 includes, in region R2 shown in FIG. 16, semiconductor substrate 1, insulting film 50 formed on the main surface of semiconductor substrate 1, interconnect line L1 formed on the main surface of semiconductor substrate 1 with insulating film 50 therebetween, interconnect line L2 formed on the main surface of semiconductor substrate 1 with insulating film 50 therebetween, conductive film 52 formed on the top surface of interconnect line L1 and larger in width than interconnect line L1, conductive film 54 formed on the top surface of interconnect line L2 and larger in width than interconnect line L2, and insulating film 55 formed to cover interconnect line L1 and interconnect line L2. Further, air gap GA is formed to extend from a point on the main surface of semiconductor substrate 1 to a level at the bottom surface of conductive film 54 and conductive film 52.

As shown in FIG. 19, in region R1 shown in FIG. 16, conductive film 52 is formed on the top surface of interconnect line L1 and conductive film 54 is not formed on the top surface of interconnect line L2. Further, the air gap is not formed between interconnect line L1 and interconnect line L2. As shown in FIG. 20, in region R1 shown in FIG. 17, conductive films 52 and 54 are not formed on respective top surfaces of interconnect lines L1 and L2, and the air gap is not formed in insulating film 55 located between interconnect lines L1 and L2.

Thus, in region R2 where the distance between interconnect line L1 and interconnect line L2 is a predetermined distance, air gap GA is formed between interconnect lines L1 and L2 to reduce the capacitance between interconnect lines L1 and L2. As the capacitance between interconnect lines L1 and L2 is reduced, for example, variations of an influence on electric current flowing in interconnect line L2 due to variations in current and voltage of interconnection line L1 can be kept small. Further, in region R1 where the distance between interconnect lines L1 and L2 is at least a predetermined distance, air gap GA is not formed to prevent air gap GA from being formed in the top surface of insulating film 55.

Further, interconnect lines L1 and L2 located in region R1 have relatively larger widths respectively to reduce the resistance of interconnect lines L1 and L2.

Figure 21:
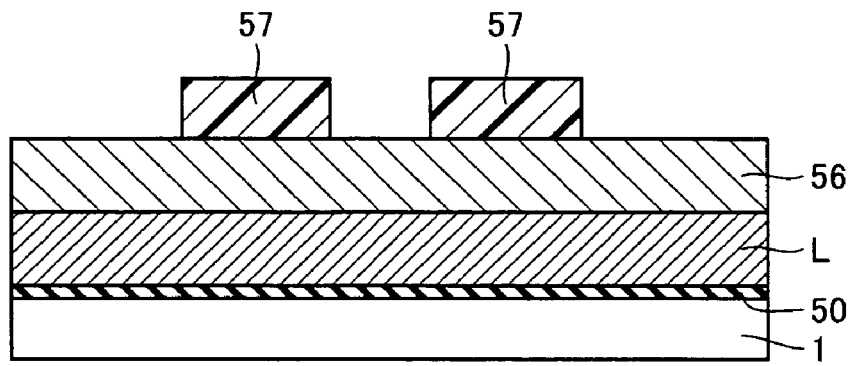
FIG. 21 is a cross-sectional view illustrating a first step of a manufacturing process of the semiconductor device.
Figure 22:
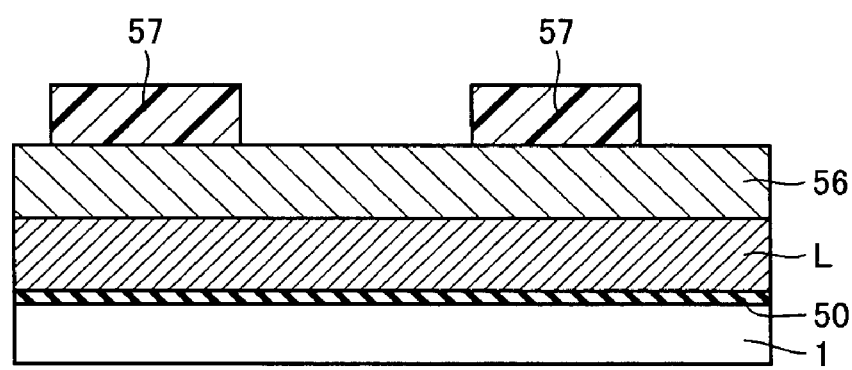
FIG. 22 is a cross-sectional view of a region different from the region in FIG. 21, illustrating the first step of the manufacturing process of the semiconductor device.
Figure 23:
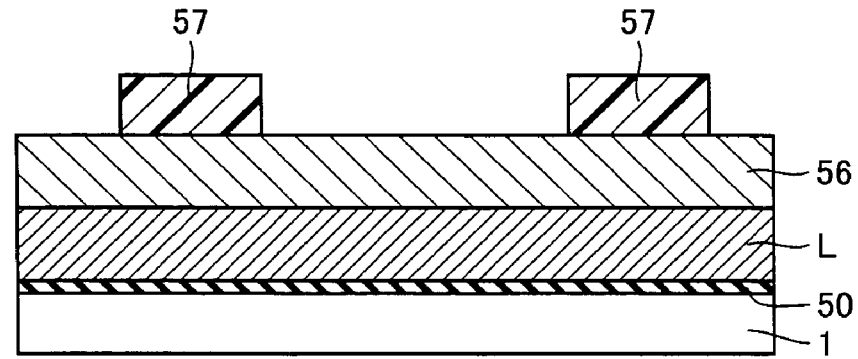
FIG. 23 is a cross-sectional view of a region different from those regions in FIGS. 21 and 22, illustrating the first step of the manufacturing process of the semiconductor device.

A method of manufacturing semiconductor device 200 structured as described above is now described with reference to FIGS. 21 to 32. FIG. 21 is a cross-sectional view illustrating a first step of a manufacturing process of semiconductor device 200, and is a cross-sectional view along line XVIII-XVIII in FIG. 16. FIG. 22 is a cross-sectional view illustrating the first step and along line XIX-XIX in FIG. 16. FIG. 23 is a cross-sectional view illustrating the first step and along line XX-XX in FIG. 17.

As shown in FIGS. 21 to 23, insulating film 50 is formed on the main surface of semiconductor substrate 1, an electrically conductive film L is formed on the top surface of insulating film 50, and an electrically conductive film 56 is formed on the top surface of conductive film L. Here, as conductive film L, for example, an Al-rich AlCu film having a higher Al content than conductive film 56 is used. As conductive film 56, a Cu-rich AlCu film having a higher Cu content than conductive film L is used. Conductive film L may be any having a stronger ionization tendency than conductive film 56. Then, a resist 57 is formed on the top surface of conductive film 56 and then patterning is carried out.

Figure 24:
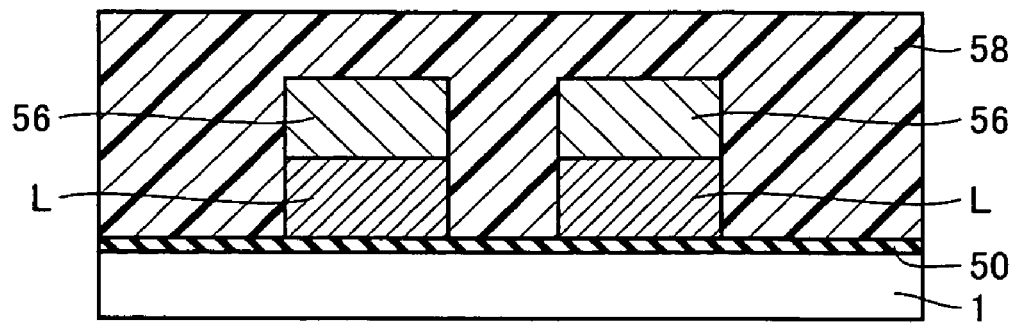
FIG. 24 is a cross-sectional view subsequent to the step shown in FIG. 21, illustrating a second step of the manufacturing process of the semiconductor device.
Figure 25:
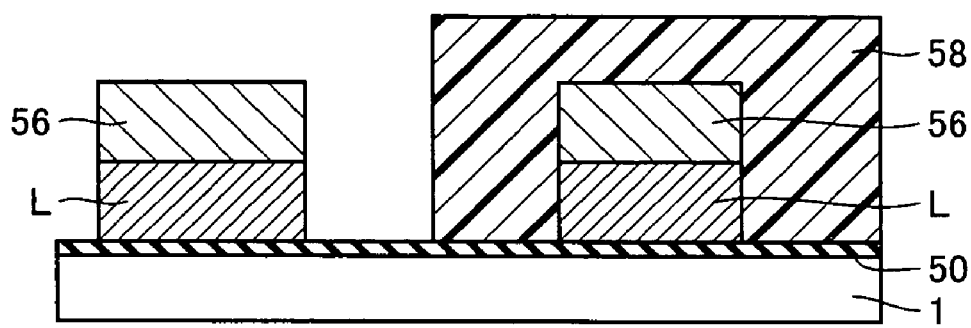
FIG. 25 is a cross-sectional view subsequent to the step shown in FIG. 22, illustrating the second step of the manufacturing process of the semiconductor device.
Figure 26:
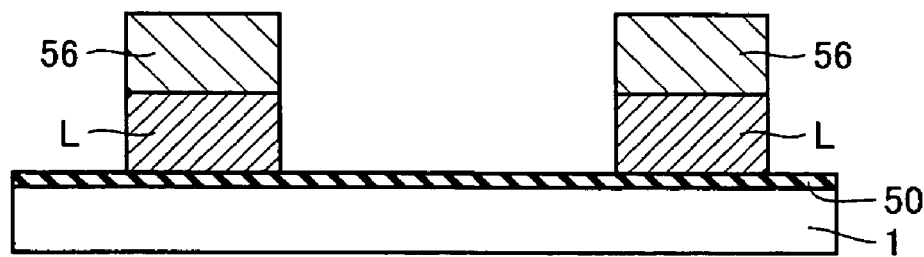
FIG. 26 is a cross-sectional view subsequent to the step shown in FIG. 23, illustrating the second step of the manufacturing process of the semiconductor device.

FIG. 24 is a cross-sectional view illustrating a second step and is a cross-sectional view subsequent to the step shown in FIG. 21. As shown in FIG. 24, in the portion to be provided as region R2 shown in FIG. 16, a resist 58 is deposited to cover a multilayered body comprised of patterned conductive film L and conductive film 56. FIG. 25 is a cross-sectional view illustrating the second step and is a cross-sectional view subsequent to the step shown in FIG. 22. As shown in FIG. 25, in the portion to be provided as region R1 of FIG. 16, resist 58 is deposited on the multilayered body to be provided as interconnect line L1. FIG. 26 is a cross-sectional view illustrating the second step and is a cross-sectional view subsequent to the step shown in FIG. 23. As shown in FIG. 26, in region R1 shown in FIG. 17, no resist is formed on the multilayered body that is thus exposed.

Figure 27:
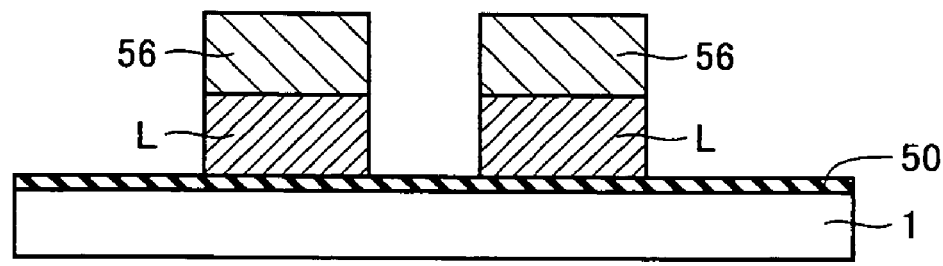
FIG. 27 is a cross-sectional view illustrating a third step of the manufacturing process of the semiconductor device.
Figure 28:
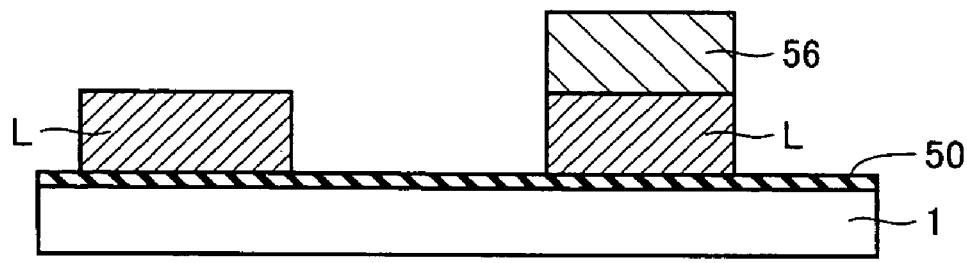
FIG. 28 is a cross-sectional view of a region different from the region in FIG. 27, illustrating the third step of the manufacturing process of the semiconductor device.
Figure 29:
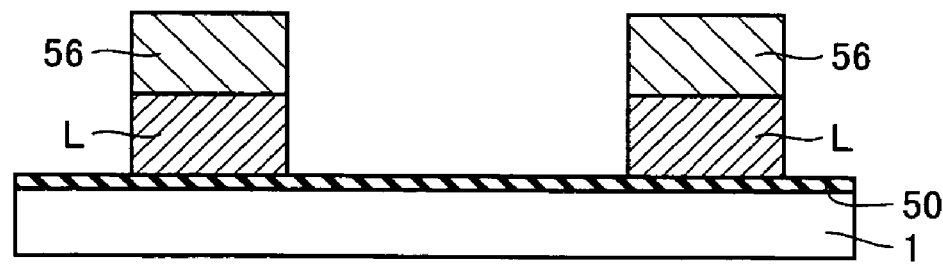
FIG. 29 is a cross sectional view of a region different from those regions in FIGS. 27 and 28, illustrating the third step of the manufacturing process of the semiconductor device.

FIGS. 27 to 29 are each a cross-sectional view illustrating a third step. As shown in FIG. 27, in the portion to be provided as region R2 of FIG. 16, conductive film 56 is left on the top surface of conductive film L. As shown in FIG. 28, in the portion to be provided as region R1 of FIG. 16, conductive film 56 formed on the top surface of conductive film L to be provided as interconnect line L2 is removed. Further, as shown in FIG. 29, in the portion to be provided as region R1 shown in FIG. 17, conductive film 56 is removed from both of conductive films L to be provided as interconnect lines L1 and L2 respectively.

Figure 30:
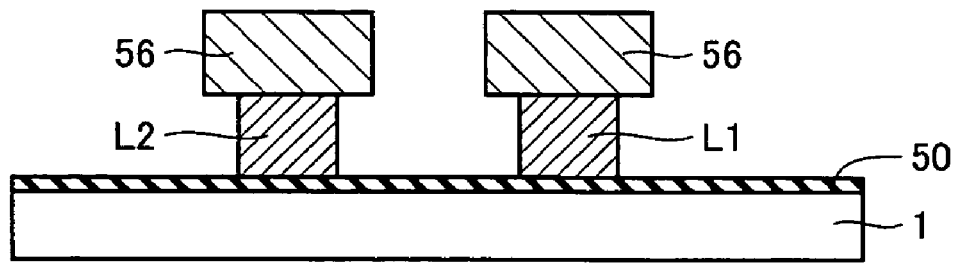
FIG. 30 is a cross-sectional view illustrating a fourth step of the manufacturing process of the semiconductor device.
Figure 31:
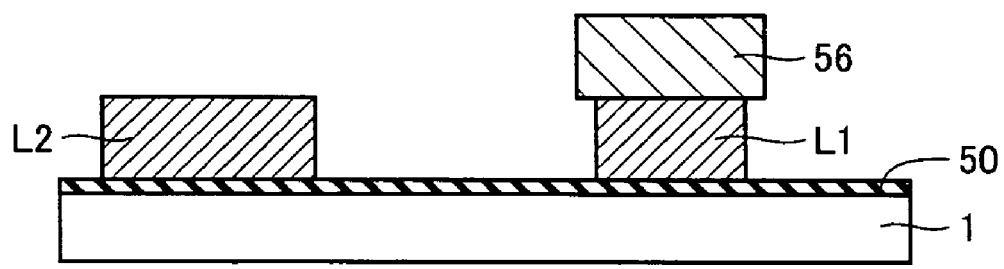
FIG. 31 is a cross-sectional view of a region different from the region in FIG. 30, illustrating the fourth step of the manufacturing process of the semiconductor device.
Figure 32:
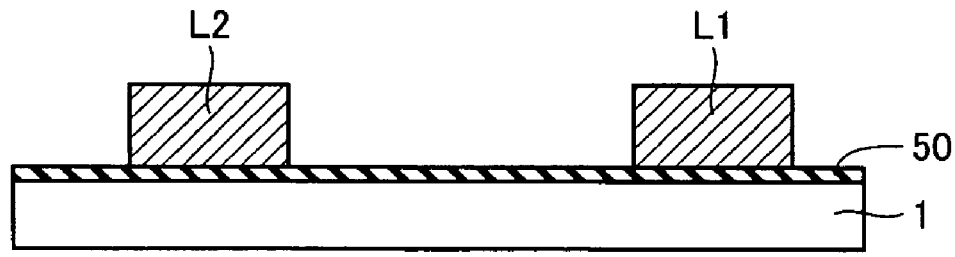
FIG. 32 is a cross-sectional view of a region different from those regions in FIGS. 30 and 31, illustrating the fourth step of the manufacturing process of the semiconductor device.

FIGS. 30 to 32 are each a cross-sectional view illustrating a fourth step. In the fourth step illustrated in FIGS. 30 to 32, wet etching is performed to form interconnect lines L1 and L2. Instead of the wet etching, a chemical solution containing ammonia hydroxide-hydrogen peroxide-water mixture may be used. Then, as shown in FIG. 30, the multilayered body shown in FIG. 27 is wet-etched so that conductive film L is mainly etched while conductive film 56 is not substantially etched, since conductive film L has a stronger ionization tendency than conductive film 56. Therefore, in the portion to be provided as region R2 shown in FIG. 16, interconnect line L1 and interconnect line L2 each smaller in width than conductive film 56 are formed under the bottom surface of conductive film 56.

As shown in FIG. 31, on the top surface of conductive film L to be provided as interconnect line L1, conductive film 56 is formed. Therefore, in a chemical solution for wet etching, an oxidation-reduction reaction occurs between this conductive film L and the chemical solution and electrons in conductive film 56 move into conductive film L. Accordingly, etching of conductive film L to be provided as interconnect line L1 is promoted. On the other hand, an oxidation-reduction reaction occurs between conductive film L to be provided as interconnect line L2 and the chemical solution so that conductive film L is etched. Here, since conductive film 56 is not formed on the top surface of this conductive film L, the etching rate for conductive film L to be provided as interconnect line L2 is lower than that of conductive film L to be provided as interconnect line L1.

Thus, interconnect line L2 has a portion having its top surface on which conductive film 56 is not formed and this portion is formed with a larger width than that of interconnect line L1 with conductive film 56 formed thereon. Further, as shown in FIG. 32, in the region to be provided as region R1 shown in FIG. 17, conductive film 56 is not formed on conductive films L to be provided as interconnect lines L1 and L2 respectively. Therefore, respective widths of interconnect lines L1 and L2 as formed are larger than those of interconnect lines L1 and L2 having conductive film 56 formed thereon as shown in FIG. 30.

Subsequently, as shown in FIGS. 18 to 20, insulating film 55 is deposited. In region R2 shown in FIG. 16, conductive film 56 larger in width than interconnect lines L1 and L2 is formed on respective top surfaces of interconnect lines L1 and L2 as shown in FIG. 30. Therefore, insulating film 55 is hindered to a certain degree from being deposited on the main surface of semiconductor substrate 1 in the region located between interconnect lines L1 and L2. On the other hand, since the distance between respective conductive films 56 formed on respective top surfaces of interconnect lines L1 and L2 is made smaller than the distance between interconnect lines L1 and L2, the space between those conductive films 56 is closed by insulating film 55. Therefore, in region R2 shown in FIG. 16, air gap GA is formed in insulating film 55 in the region located between interconnect lines L1 and L2.

In region R1 shown in FIG. 16, conductive film 56 larger in width than interconnect line L1 is formed on interconnect line L1 while conductive film 56 is not formed on interconnect line L2 as shown in FIG. 31. Therefore, insulating film 55 is deposited on the main surface of semiconductor substrate 1 in the region located between interconnect lines L1 and L2. As shown in FIG. 19, the space between interconnect lines L1 and L2 is filled with insulating film 55. Further, in region R1 shown in FIG. 17, conductive film 56 is not formed on respective top surfaces of interconnect lines L1 and L2 as shown in FIG. 32. Therefore, insulating film 55 is appropriately deposited on the main surface of semiconductor substrate 1 in the region located between interconnect lines L1 and L2. Therefore, as shown in FIG. 20, the space between interconnect lines L1 and L2 is filled with insulating film 55. Through the steps as described above, semiconductor device 200 can be manufactured.

The present invention is suitable for the nonvolatile semiconductor memory device, the semiconductor device and the method of manufacturing a nonvolatile semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
    a semiconductor substrate;
    a first floating gate formed on a main surface of said semiconductor substrate with a first electrically insulating film therebetween;
    a second floating gate formed on the main surface of said semiconductor substrate with a second electrically insulating film therebetween;
    a first control gate formed on said first floating gate with a third electrically insulating film therebetween and having a first wider portion larger than said first floating gate in width in the direction parallel with the main surface of said semiconductor substrate;
    a second control gate formed on said second floating gate with a fourth electrically insulating film therebetween and having a second wider portion larger than said second floating gate in width in the direction parallel with the main surface of said semiconductor substrate;
    an interlayer insulating film formed to cover said first control gate and said second control gate; and
    a gap formed in said interlayer insulating film in at least a portion located between said first floating gate and said second floating gate.

2. The nonvolatile semiconductor memory device according to claim 1, wherein
    said gap is formed below a portion of contact between a part of said interlayer insulating film that covers said first wider portion and a part of said interlayer insulating film that covers said second wider portion.

3. The nonvolatile semiconductor memory device according to claim 1, wherein
    said third electrically insulating film is formed to be larger than said first floating gate in width in the direction parallel with the main surface of said semiconductor substrate,
    said fourth electrically insulating film is formed to be larger than said second floating gate in width in the direction parallel with the main surface of said semiconductor substrate,
    said first control gate includes a first electrically conductive film formed to be larger than said first floating gate in width in the direction parallel with the main surface of said semiconductor substrate, and a second electrically conductive film formed on a top surface of said first electrically conductive film and formed to be smaller than said first electrically conductive film in width in the direction parallel with the main surface of said semiconductor substrate,
    said second control gate includes a third electrically conductive film formed to be larger than said second floating gate in width in the direction parallel with the main surface of said semiconductor substrate, and a fourth electrically conductive film formed on a top surface of said third electrically conductive film and formed to be smaller than said third electrically conductive film in width in the direction parallel with the main surface of said semiconductor substrate, said first wider portion is said first electrically conductive film, and said second wider portion is said third electrically conductive film.

4. The nonvolatile semiconductor memory device according to claim 3, wherein said first electrically conductive film and said second electrically conductive film contact each other, said third electrically conductive film and said fourth electrically conductive film contact each other, said first electrically conductive film is weaker in ionization tendency than said second electrically conductive film, and said third electrically conductive film is weaker in ionization tendency than said fourth electrically conductive film.

5. A semiconductor device comprising:

a semiconductor substrate;

a first interconnect line formed on a main surface of said semiconductor substrate with a first electrically insulating film therebetween;

a second interconnect line formed on the main surface of said semiconductor substrate with a second electrically insulating film therebetween to extend along said first interconnect line;

a first electrically conductive film formed on a top surface of said first interconnect line and formed to be larger than said first interconnect line in width in the direction parallel with the main surface of said semiconductor substrate;

a second electrically conductive film formed on a top surface of said second interconnect line and formed to be larger than said second interconnect line in width in the direction parallel with the main surface of said semiconductor substrate;

a third electrically insulating film formed to cover said first electrically conductive film and said second electrically conductive film;

a first region where the distance between said first interconnect line and said second interconnect line is at most a predetermined value;

a second region where the distance between said first interconnect line and said second interconnect line is larger than said predetermined value; and a gap that is in said first region where said first electrically conductive film and said second electrically conductive film are formed and that is formed in said third electrically insulating film between said first interconnect line and said second interconnect line located in said first region.

6. The semiconductor device according to claim 5, wherein said first interconnect line and said first electrically conductive film contact each other, said second interconnect line and said second electrically conductive film contact each other, said first electrically conductive film is weaker in ionization tendency than said first interconnect line, and said second electrically conductive film is weaker in ionization tendency than said second interconnect line.

7. A method of manufacturing a nonvolatile semiconductor memory device, comprising the steps of:

forming a first floating gate on a main surface of a semiconductor substrate with a first electrically insulating film therebetween and forming a second floating gate on the main surface of said semiconductor substrate with a second electrically insulating film therebetween;

forming a first control gate on a top surface of said first floating gate with a third electrically insulating film therebetween and forming a second control gate on a top surface of said second floating gate with a fourth electrically insulating film therebetween;

forming a first wider portion of said first control gate by reducing, in film size in the direction parallel with the main surface of said semiconductor substrate, said first floating gate and a part of said first control gate, said first wider portion being larger, in width in the direction parallel with the main surface of said semiconductor substrate, than said first floating gate reduced in film size;

forming a second wider portion of said second control gate by reducing, in film size in the direction parallel with the main surface of said semiconductor substrate, said second floating gate and a part of said second control gate, said second wider portion being larger, in width in the direction parallel with the main surface of said semiconductor substrate, than said second floating gate reduced in film size; and forming an interlayer insulating film covering said first control gate and said second control gate, allowing a portion of said interlayer insulating film that covers said first wider portion to contact a portion of said interlayer insulating film that covers said second wider portion, and forming a gap between said first floating gate and said second floating gate.

8. The method of manufacturing a nonvolatile semiconductor memory device according to claim 7, wherein said reducing in film size includes the step of reducing, in film size, said first floating gate by causing to retreat side surfaces of said first floating gate that are located side by side in the direction orthogonal to said first control gate, and reducing, in film size, said second floating gate by causing to retreat side surfaces of said second floating gate that are located side by side in the direction orthogonal to said second control gate.

9. The method of manufacturing a nonvolatile semiconductor memory device according to claim 7, wherein said step of forming the first control gate includes the steps of forming a first electrically conductive film on a top surface of the third electrically insulating film, and forming a second electrically conductive film, stronger in ionization tendency than said first electrically conductive film, on a top surface of said first electrically conductive film, said step of forming the second control gate includes the steps of forming a third electrically conductive film on a top surface of the third electrically insulating film, and forming a fourth electrically conductive film, stronger in ionization tendency than said third electrically conductive film, on a top surface of said third electrically conductive film, and said reducing in film size includes the step of reducing, in film size, said first floating gate, said second floating gate, said first control gate, and said second control gate, by using a processing solution with which an oxidation-reduction reaction occurs between said processing solution and said first floating gate, said second floating gate, said first control gate, and said second control gate.

* * * * *